US012573449B2

(12) United States Patent
Jung et al.

(10) Patent No.: US 12,573,449 B2
(45) Date of Patent: Mar. 10, 2026

(54) METHODS OF TESTING NONVOLATILE MEMORY DEVICES AND NONVOLATILE MEMORY DEVICES

(71) Applicant: Samsung Electronics Co., Ltd., Suwon-si (KR)

(72) Inventors: Yeonwook Jung, Suwon-si (KR); Myeongwoo Lee, Suwon-si (KR); Jongchul Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 79 days.

(21) Appl. No.: 18/341,815

(22) Filed: Jun. 27, 2023

(65) Prior Publication Data

US 2024/0127883 A1 Apr. 18, 2024

(51) Int. Cl.
*G11C 11/40* (2006.01)
*G11C 11/4093* (2006.01)
*G11C 11/4094* (2006.01)

(52) U.S. Cl.
CPC ...... *G11C 11/4093* (2013.01); *G11C 11/4094* (2013.01)

(58) Field of Classification Search
CPC ..................... G11C 11/4093; G11C 11/4094
See application file for complete search history.

(56) References Cited

U.S. PATENT DOCUMENTS

| | | | | |
|---|---|---|---|---|
| 6,028,758 | A * | 2/2000 | Sharpe-Geisler .... | H10D 89/601 |
| | | | | 361/111 |
| 6,483,384 | B1 * | 11/2002 | Chimura ............. | H03F 3/45183 |
| | | | | 330/257 |
| 7,400,533 | B2 | 7/2008 | Roohparvar | |
| 7,646,658 | B2 | 1/2010 | Chen et al. | |
| 7,733,699 | B2 | 6/2010 | Roohparvar | |
| 8,233,342 | B2 | 7/2012 | Adams et al. | |
| 8,243,539 | B2 | 8/2012 | Takizawa et al. | |
| 8,261,141 | B1 | 9/2012 | Choe et al. | |
| 8,456,887 | B2 | 6/2013 | Iwata | |
| 9,196,330 | B2 | 11/2015 | Ge et al. | |
| 9,230,677 | B2 | 1/2016 | Lee | |
| 9,583,170 | B2 | 2/2017 | Kim et al. | |
| 10,026,747 | B2 * | 7/2018 | Hwang .................. | G11C 5/02 |
| 10,510,429 | B2 | 12/2019 | Choi et al. | |
| 11,462,285 | B2 * | 10/2022 | Lim ...................... | G11C 16/26 |
| 12,009,043 | B2 * | 6/2024 | Kim .................. | G11C 29/4401 |

* cited by examiner

*Primary Examiner* — Vanthu T Nguyen
(74) *Attorney, Agent, or Firm* — Harness, Dickey & Pierce, P.L.C.

(57) ABSTRACT

In a method of testing a nonvolatile memory device including a first semiconductor layer in which and a second semiconductor layer formed prior to the first semiconductor layer, circuit elements including a page buffer circuit and at least one driver spaced apart from the page buffer circuit are provided in the second semiconductor layer, an on-state of nonvolatile memory cells which are not connected to the page buffer circuit is mimicked by providing at least one discharging path between a sensing node and a plurality of discharge transistors of the at least one driver, a sensing and latching operation with the on-state being mimicked is performed in the page buffer circuit and whether the page buffer circuit operates normally is determined based on a result of the sensing and latching operation.

20 Claims, 31 Drawing Sheets

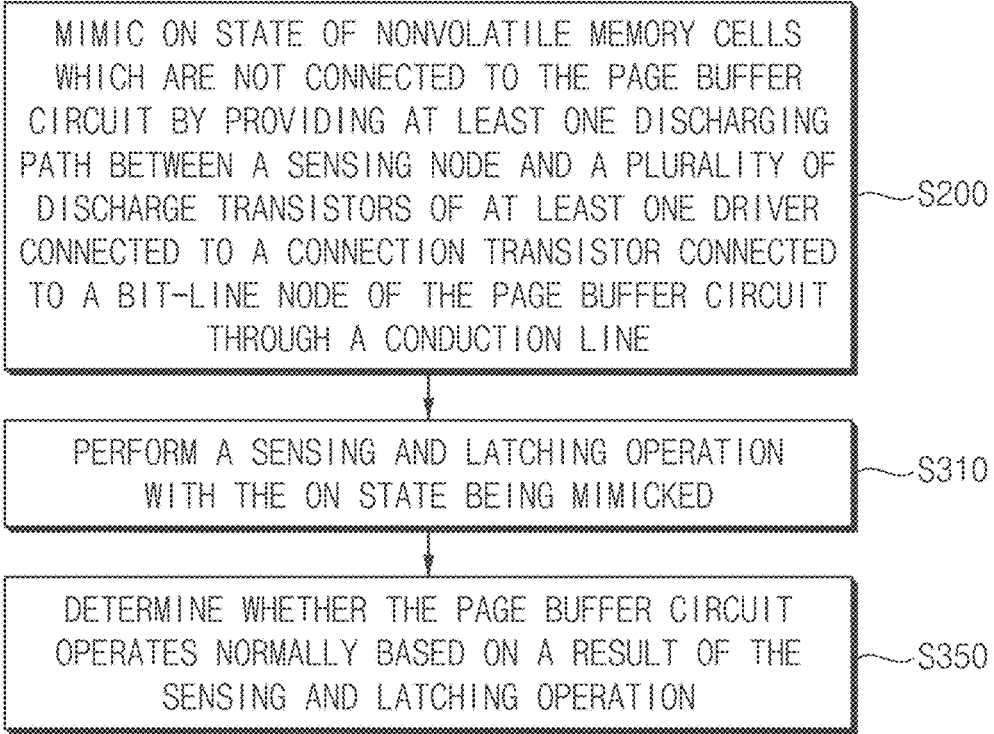

MIMIC ON STATE OF NONVOLATILE MEMORY CELLS WHICH ARE NOT CONNECTED TO THE PAGE BUFFER CIRCUIT BY PROVIDING AT LEAST ONE DISCHARGING PATH BETWEEN A SENSING NODE AND A PLURALITY OF DISCHARGE TRANSISTORS OF AT LEAST ONE DRIVER CONNECTED TO A CONNECTION TRANSISTOR CONNECTED TO A BIT-LINE NODE OF THE PAGE BUFFER CIRCUIT THROUGH A CONDUCTION LINE — S200

PERFORM A SENSING AND LATCHING OPERATION WITH THE ON STATE BEING MIMICKED — S310

DETERMINE WHETHER THE PAGE BUFFER CIRCUIT OPERATES NORMALLY BASED ON A RESULT OF THE SENSING AND LATCHING OPERATION — S350

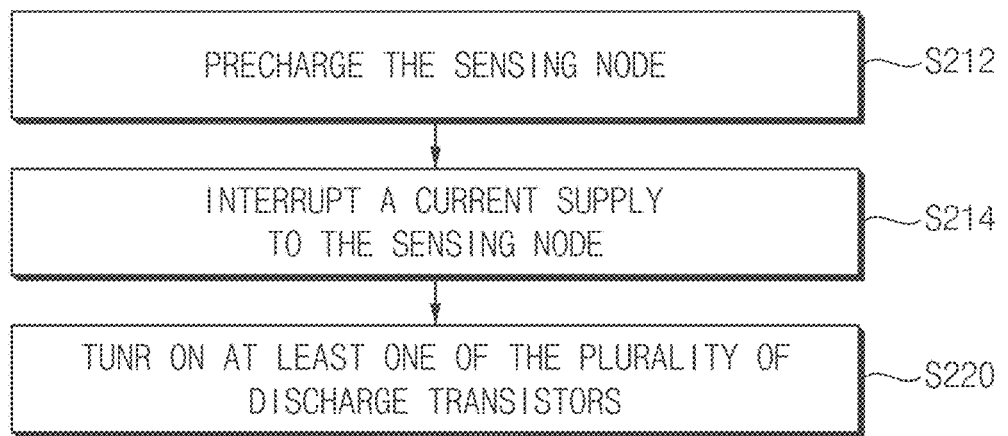

PRECHARGE THE SENSING NODE — S212

INTERRUPT A CURRENT SUPPLY TO THE SENSING NODE — S214

TUNR ON AT LEAST ONE OF THE PLURALITY OF DISCHARGE TRANSISTORS — S220

Figures 3B, 4, 5:
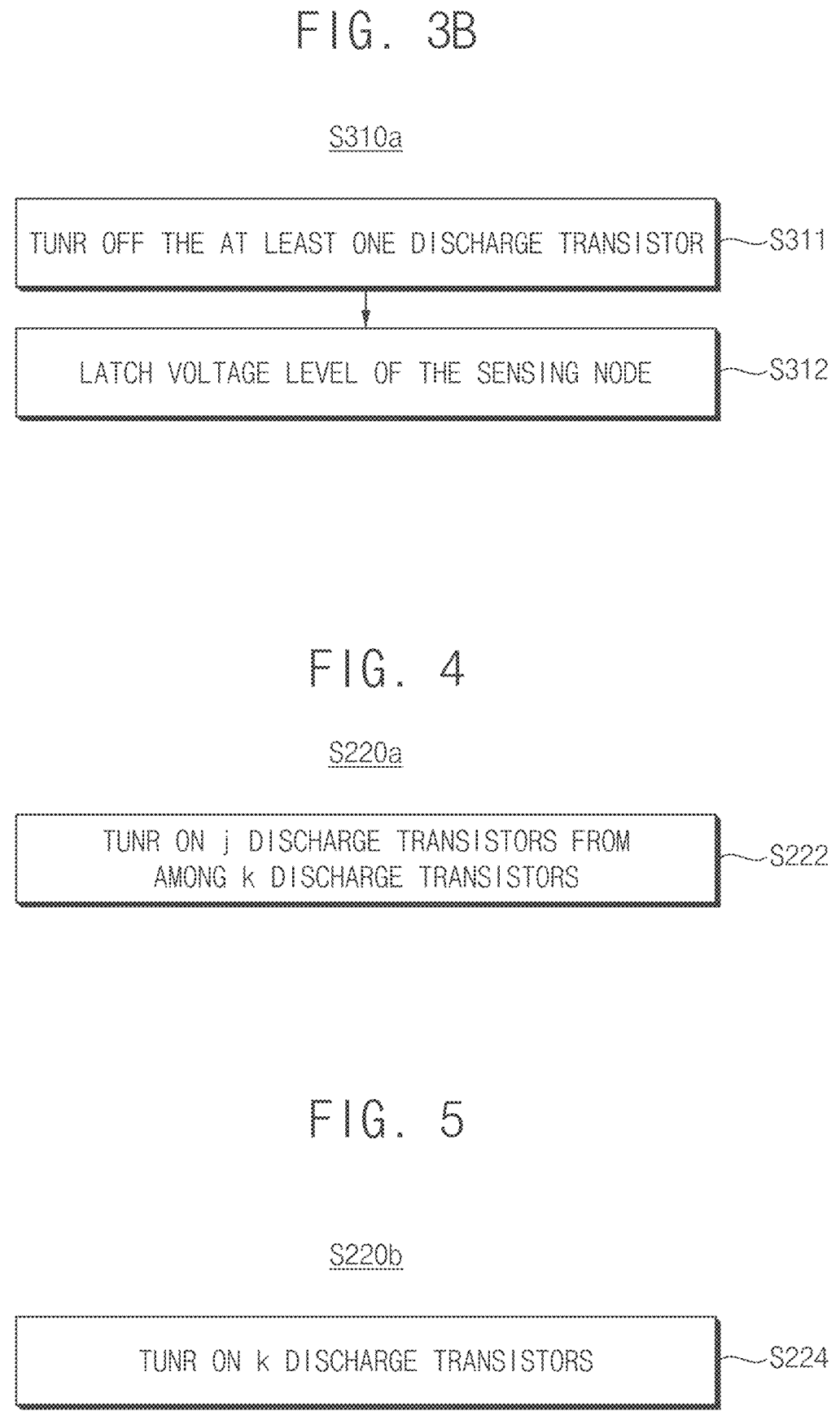

| TUNR OFF THE AT LEAST ONE DISCHARGE TRANSISTOR |—S311

| LATCH VOLTAGE LEVEL OF THE SENSING NODE |—S312

| TUNR ON j DISCHARGE TRANSISTORS FROM AMONG k DISCHARGE TRANSISTORS |—S222

| TUNR ON k DISCHARGE TRANSISTORS |—S224

FIG. 6A

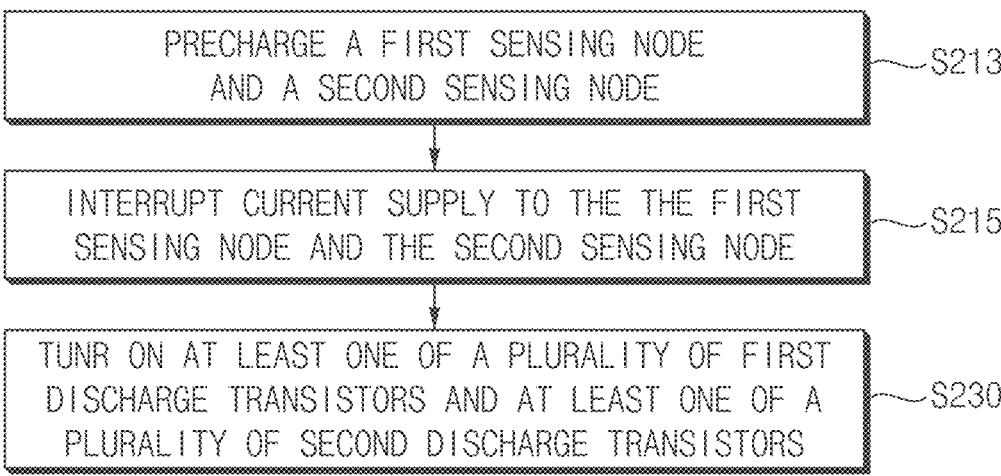

S200b

| PRECHARGE A FIRST SENSING NODE AND A SECOND SENSING NODE | ~S213 |

| INTERRUPT CURRENT SUPPLY TO THE THE FIRST SENSING NODE AND THE SECOND SENSING NODE | ~S215 |

| TUNR ON AT LEAST ONE OF A PLURALITY OF FIRST DISCHARGE TRANSISTORS AND AT LEAST ONE OF A PLURALITY OF SECOND DISCHARGE TRANSISTORS | ~S230 |

FIG. 6B

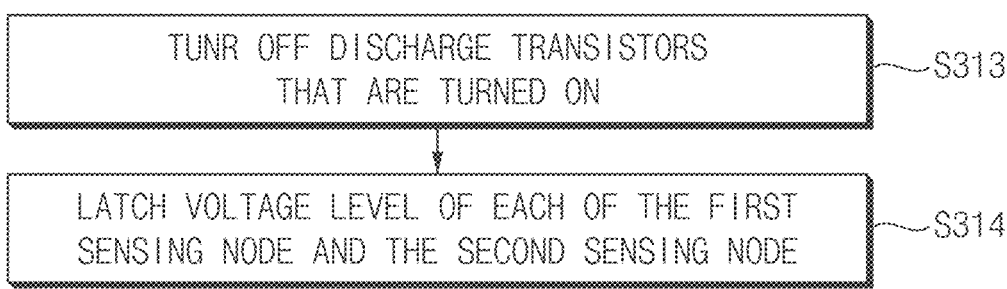

S310b

| TUNR OFF DISCHARGE TRANSISTORS THAT ARE TURNED ON | ~S313 |

| LATCH VOLTAGE LEVEL OF EACH OF THE FIRST SENSING NODE AND THE SECOND SENSING NODE | ~S314 |

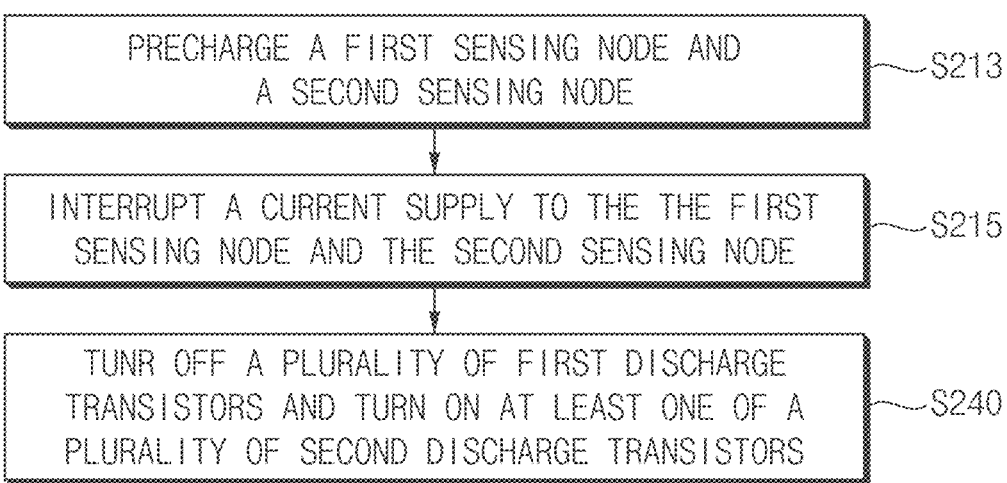

| PRECHARGE A FIRST SENSING NODE AND A SECOND SENSING NODE | ~S213 |

| INTERRUPT A CURRENT SUPPLY TO THE THE FIRST SENSING NODE AND THE SECOND SENSING NODE | ~S215 |

| TUNR OFF A PLURALITY OF FIRST DISCHARGE TRANSISTORS AND TURN ON AT LEAST ONE OF A PLURALITY OF SECOND DISCHARGE TRANSISTORS | ~S240 |

| TUNR OFF THE AT LEAST ONE DISCHARGE TRANSISTORS THAT ARE TURNED ON | ~S315 |

| LATCH VOLTAGE LEVEL OF EACH OF THE FIRST SENSING NODE AND THE SECOND SENSING NODE | ~S316 |

FIG. 25
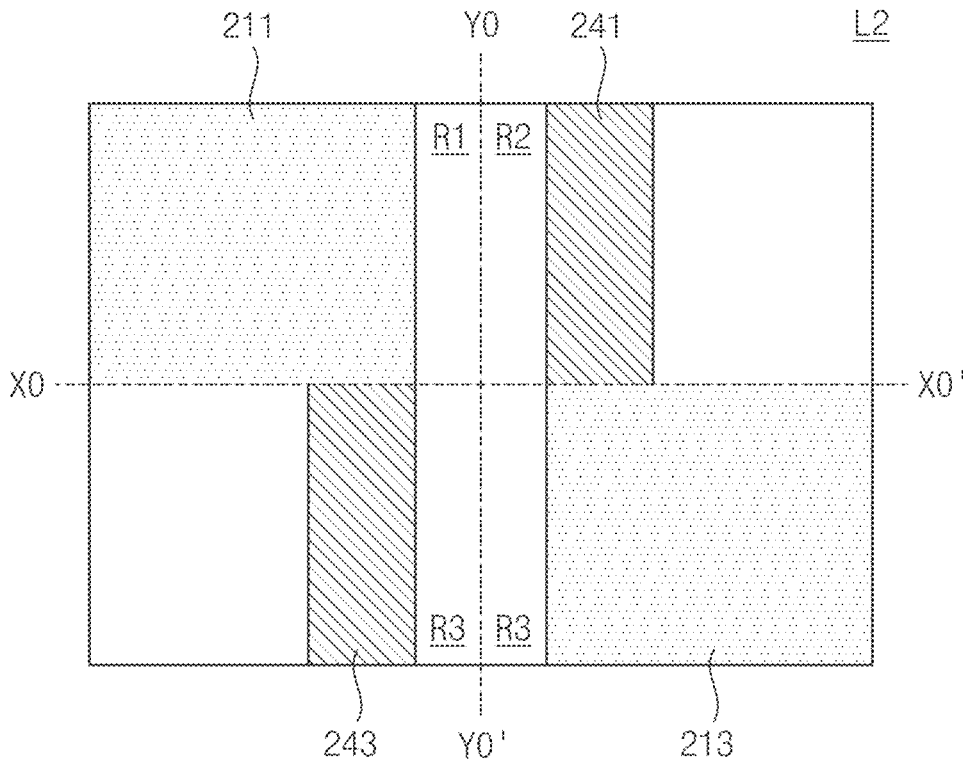
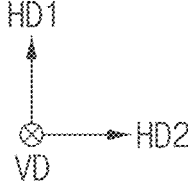

Figure 26:
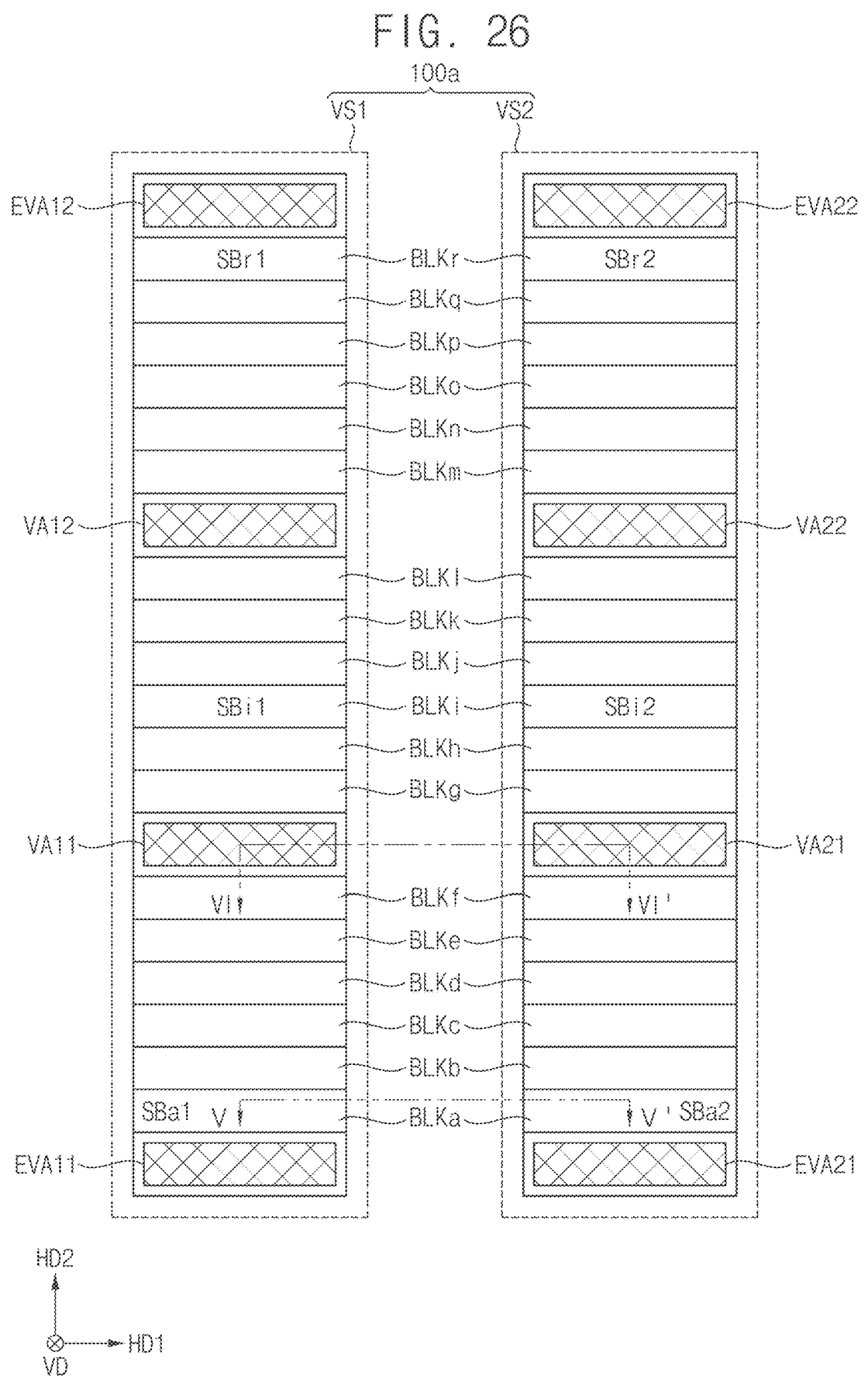

EVA12    EVA22

SBr1    BLKr    SBr2

BLKq

BLKp

BLKo

BLKn

BLKm

VA12    VA22

BLKl

BLKk

BLKj

SBi1    BLKi    SBi2

BLKh

BLKg

VA11    VA21

VI    BLKf    VI'

BLKe

BLKd

BLKc

BLKb

SBa1    V    BLKa    V'    SBa2

EVA11    EVA21

CUTTING

WF2
WF1

BONDING

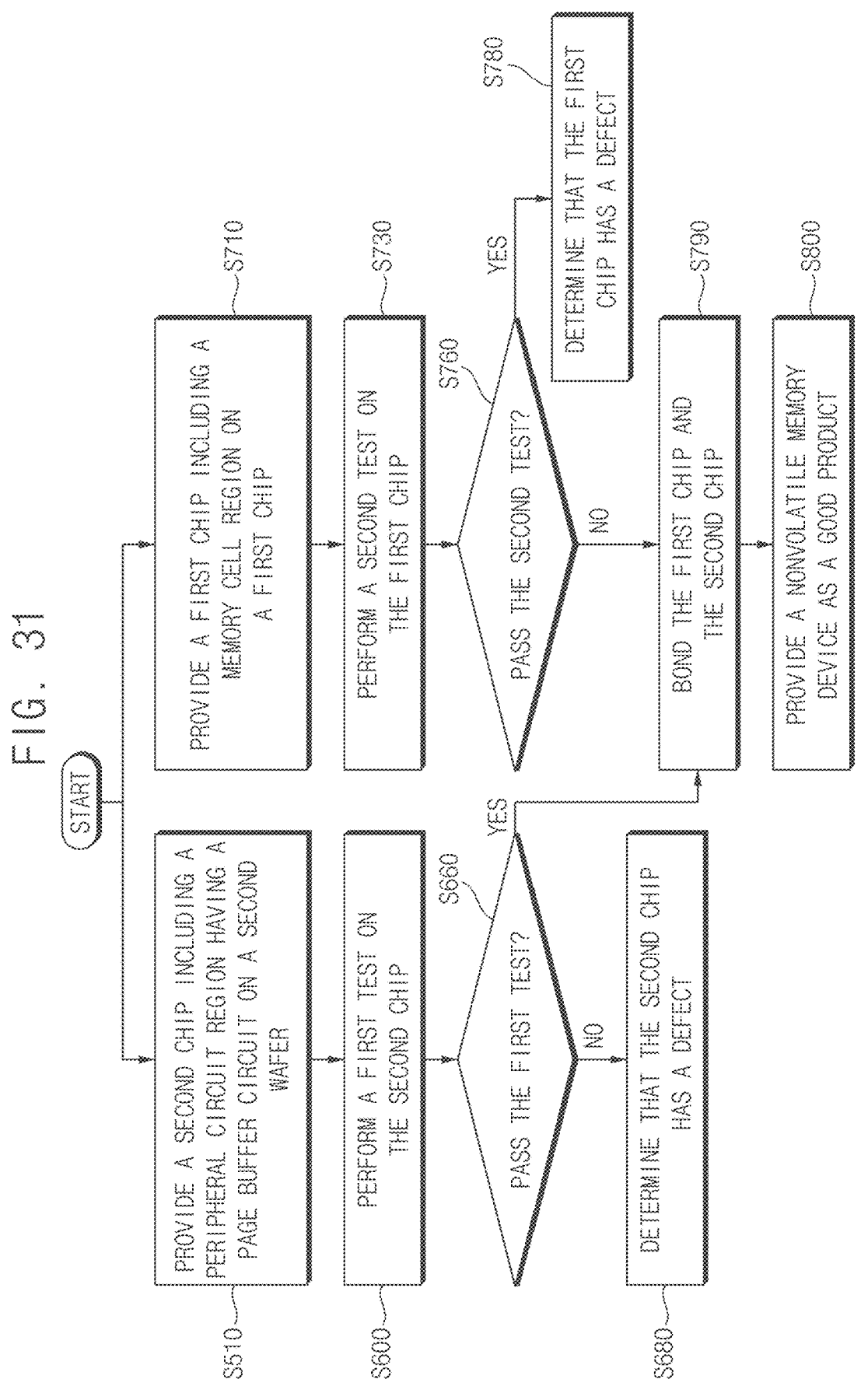

START

S710 — PROVIDE A FIRST CHIP INCLUDING A MEMORY CELL REGION ON A FIRST CHIP

S730 — PERFORM A SECOND TEST ON THE FIRST CHIP

S760 — PASS THE SECOND TEST?

YES — S780 — DETERMINE THAT THE FIRST CHIP HAS A DEFECT

S510 — PROVIDE A SECOND CHIP INCLUDING A PERIPHERAL CIRCUIT REGION HAVING A PAGE BUFFER CIRCUIT ON A SECOND WAFER

S600 — PERFORM A FIRST TEST ON THE SECOND CHIP

S660 — PASS THE FIRST TEST?

NO — S680 — DETERMINE THAT THE SECOND CHIP HAS A DEFECT

YES

NO — S790 — BOND THE FIRST CHIP AND THE SECOND CHIP

S800 — PROVIDE A NONVOLATILE MEMORY DEVICE AS A GOOD PRODUCT

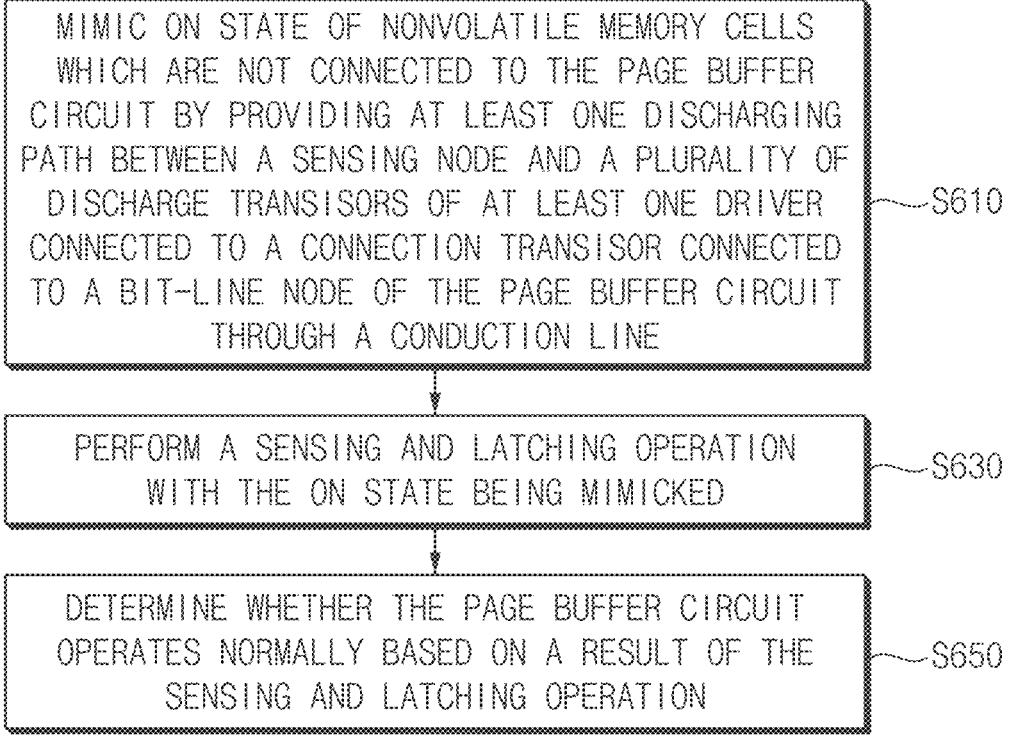

MIMIC ON STATE OF NONVOLATILE MEMORY CELLS
WHICH ARE NOT CONNECTED TO THE PAGE BUFFER
CIRCUIT BY PROVIDING AT LEAST ONE DISCHARGING
PATH BETWEEN A SENSING NODE AND A PLURALITY OF
DISCHARGE TRANSISORS OF AT LEAST ONE DRIVER          S610
CONNECTED TO A CONNECTION TRANSISOR CONNECTED
TO A BIT-LINE NODE OF THE PAGE BUFFER CIRCUIT
THROUGH A CONDUCTION LINE

PERFORM A SENSING AND LATCHING OPERATION
WITH THE ON STATE BEING MIMICKED          S630

DETERMINE WHETHER THE PAGE BUFFER CIRCUIT
OPERATES NORMALLY BASED ON A RESULT OF THE          S650
SENSING AND LATCHING OPERATION

METHODS OF TESTING NONVOLATILE MEMORY DEVICES AND NONVOLATILE MEMORY DEVICES

CROSS-REFERENCE TO RELATED APPLICATIONS

This U.S. application claims the benefit of priority under 35 USC § 119 to Korean Patent Application No. 10-2022-0133940, filed on Oct. 18, 2022 in the Korean Intellectual Property Office, the disclosure of which is incorporated herein by reference in its entirety.

BACKGROUND

Various example embodiments generally relate to semiconductor memory devices, and more particularly to methods of fabricating and/or testing nonvolatile memory devices and/or of nonvolatile memory devices.

Semiconductor memory devices for storing data may be classified into volatile memory devices and nonvolatile memory devices. Volatile memory devices, such as dynamic random access memory (DRAM) and/or static random access memory (SRAM) devices, are typically configured to store data by charging or discharging capacitors in memory cells and/or in latches in memory cells, and my lose the stored data when power is off. Nonvolatile memory devices, such as flash memory devices, may maintain stored data even though power is off. Volatile memory devices are widely used as main memories of various devices, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration and memory capacity of the nonvolatile memory devices. In the nonvolatile memory devices of a three-dimensional structure, a peripheral circuit and a memory cell array are sequentially or individually (e.g. separately) manufactured, and the peripheral circuit needs to be tested in various environments with the memory cell array not being connected to the peripheral circuit.

SUMMARY

Various example embodiments may provide a method of testing or fabricating a nonvolatile memory device, capable of performing an on-cell test with a memory cells not being connected to a peripheral circuit.

Alternatively or additionally, some example embodiments may provide a nonvolatile memory device, capable of performing an on-cell test with a memory cells not being connected to a peripheral circuit.

According to some example embodiments, in a method of testing or fabricating a nonvolatile memory device including a first semiconductor layer and a second semiconductor layer, wherein a plurality of nonvolatile memory cells, a plurality of word-lines, and a plurality of bit-lines are provided in the first semiconductor layer, and the second semiconductor layer is formed prior to the first semiconductor layer, circuit elements including a page buffer circuit and at least one driver spaced apart from the page buffer circuit is in the second semiconductor layer by forming semiconductor elements and patterns for wiring the semiconductor elements in the second semiconductor layer, an on-state of nonvolatile memory cells which are not connected to the page buffer circuit is mimicked by providing at least one discharging path between a sensing node of the page buffer circuit and a plurality of discharge transistors of the at least one driver which is connected to a connection transistor coupled to a bit-line node of the page buffer circuit through a conduction line, a sensing and latching operation is performed in the page buffer circuit with the on-state being mimicked, and whether the page buffer circuit operates normally is determined based on a result of the sensing and latching operation.

Alternatively or additionally, according to some example embodiments, in a method of testing or fabricating a nonvolatile memory device including a first chip and a second chip, wherein the first chip includes a memory cell region and is on a first wafer and the second chip includes a peripheral circuit region having a page buffer circuit and is on a second wafer different from the first wafer, circuit elements including the page buffer circuit and at least one driver spaced apart from the page buffer circuit in the second semiconductor layer is provided by forming semiconductor elements and patterns for wiring the semiconductor elements in a first substrate on the second wafer, an on-state of nonvolatile memory cells which are not connected to the page buffer circuit is mimicked by providing at least one discharging path between a sensing node of the page buffer circuit and a plurality of discharge transistors of the at least one driver which is connected to a connection transistor coupled to a bit-line node of the page buffer circuit through a conduction line, a sensing and latching operation is performed in the page buffer circuit with the on-state being mimicked, and whether the page buffer circuit operates normally is determined based on a result of the sensing and latching operation.

Alternatively or additionally according to some example embodiments, a nonvolatile memory device includes a first semiconductor layer and a second semiconductor layer that is below the first semiconductor layer. A plurality of nonvolatile memory cells, a plurality of word-lines and a plurality of bit-lines are provided in the first semiconductor layer. The second semiconductor layer includes circuit elements including a page buffer circuit, at least one driver spaced apart from the page buffer circuit. and a control circuit by having semiconductor elements and patterns for wiring the semiconductor elements in the second semiconductor layer. The control circuit, with the first semiconductor layer not being connected to the second semiconductor layer, is configured to mimic an on-state of nonvolatile memory cells which are not connected to the page buffer circuit by providing at least one discharging path between a sensing node of the page buffer circuit and a plurality of discharge transistors of the at least one driver which is connected to a connection transistor coupled to a bit-line node of the page buffer circuit through a conduction line, to perform, in the page buffer circuit, a sensing and latching operation with the on-state being mimicked, to determine whether the page buffer circuit operates normally based on a result of the sensing and latching operation, and to provide a result of the determination to an external test device.

Accordingly, according to various example embodiments, a test on a page buffer circuit, which is formed individually from or prior to a memory cell array, may be performed by mimicking an on-state of memory cells, which are not connected to the page buffer circuit, by providing at least one discharging path between a sensing node and a plurality of discharge transistors of at least one driver. Therefore, a test with respect to various test items may be performed on an off-state of the memory cells and an on-state of the memory cells with the memory cells not being connected to the page buffer circuit, and thus may enhance test coverage and/or improve quality and/or yield of the memory device.

BRIEF DESCRIPTION OF THE DRAWINGS

Illustrative, non-limiting example embodiments will be more clearly understood from the following detailed description in conjunction with the accompanying drawings.

FIG. 2 is a flow chart illustrating example operations of a first test on the circuit elements in FIG. 1 according to some example embodiments.

FIG. 3A is a flow chart illustrating detailed operations of mimicking the on-state in FIG. 2 according to some example embodiments.

FIG. 3B is a flow chart illustrating detailed operations of performing the sensing and latching operation in FIG. 2 according to some example embodiments.

FIG. 4 illustrates an example operation of turning on the at least one discharge transistor in FIG. 3A according to some example embodiments.

FIG. 5 illustrates an example operation of turning on the at least one discharge transistor in FIG. 3A according to some example embodiments.

FIG. 6A is a flow chart illustrating detailed operations of mimicking the on-state in FIG. 2 according to some example embodiments.

FIG. 6B is a flow chart illustrating detailed operations of performing the sensing and latching operation in FIG. 2 according to some example embodiments.

FIG. 7A is a flow chart illustrating detailed operations of mimicking the on-state in FIG. 2 according to some example embodiments.

FIG. 7B is a flow chart illustrating detailed operations of performing the sensing and latching operation in FIG. 2 according to some example embodiments.

FIG. 21 illustrates a page buffer and at least one driver in the nonvolatile memory device of FIG. 8 according to some example embodiments.

FIG. 25 is a plan view illustrating a top surface of the second semiconductor layer in the nonvolatile memory device of FIG. 10 according to some example embodiments.

FIG. 26 is a plan view illustrating a top surface of the first semiconductor layer, overlapping the plan view of the FIG. 25.

FIG. 30 is a diagram illustrating a manufacturing process of a stacked semiconductor device according to some example embodiments.

FIG. 31 is a flow chart illustrating a method of manufacturing a nonvolatile memory device according to some example embodiments.

FIG. 32 is a flow chart illustrating operations of a first test on the second chip in FIG. 31 according to some example embodiments.

DETAILED DESCRIPTION OF EXAMPLE EMBODIMENTS

Various example embodiments will be described more fully hereinafter with reference to the accompanying drawings, in which some example embodiments are shown.

Figure 1:
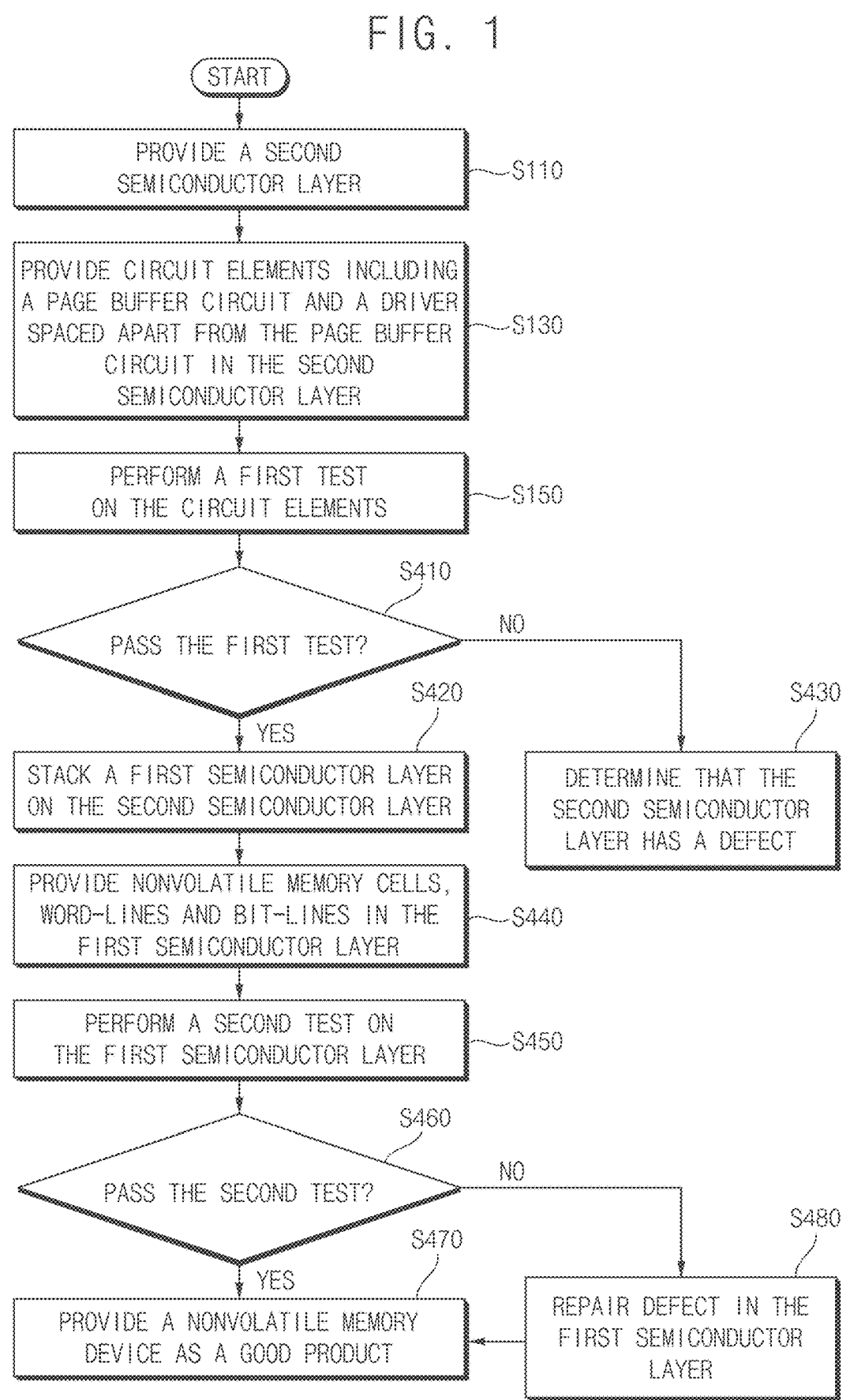
FIG. 1 is a flow chart illustrating a method of manufacturing a nonvolatile memory device according to some example embodiments.

FIG. 1 is a flow chart illustrating a method of manufacturing a nonvolatile memory device according to some example embodiments.

For convenience of explanation, a method of manufacturing a nonvolatile memory device will be explained with reference to FIGS. 1, 8 and 10.

Figure 8:
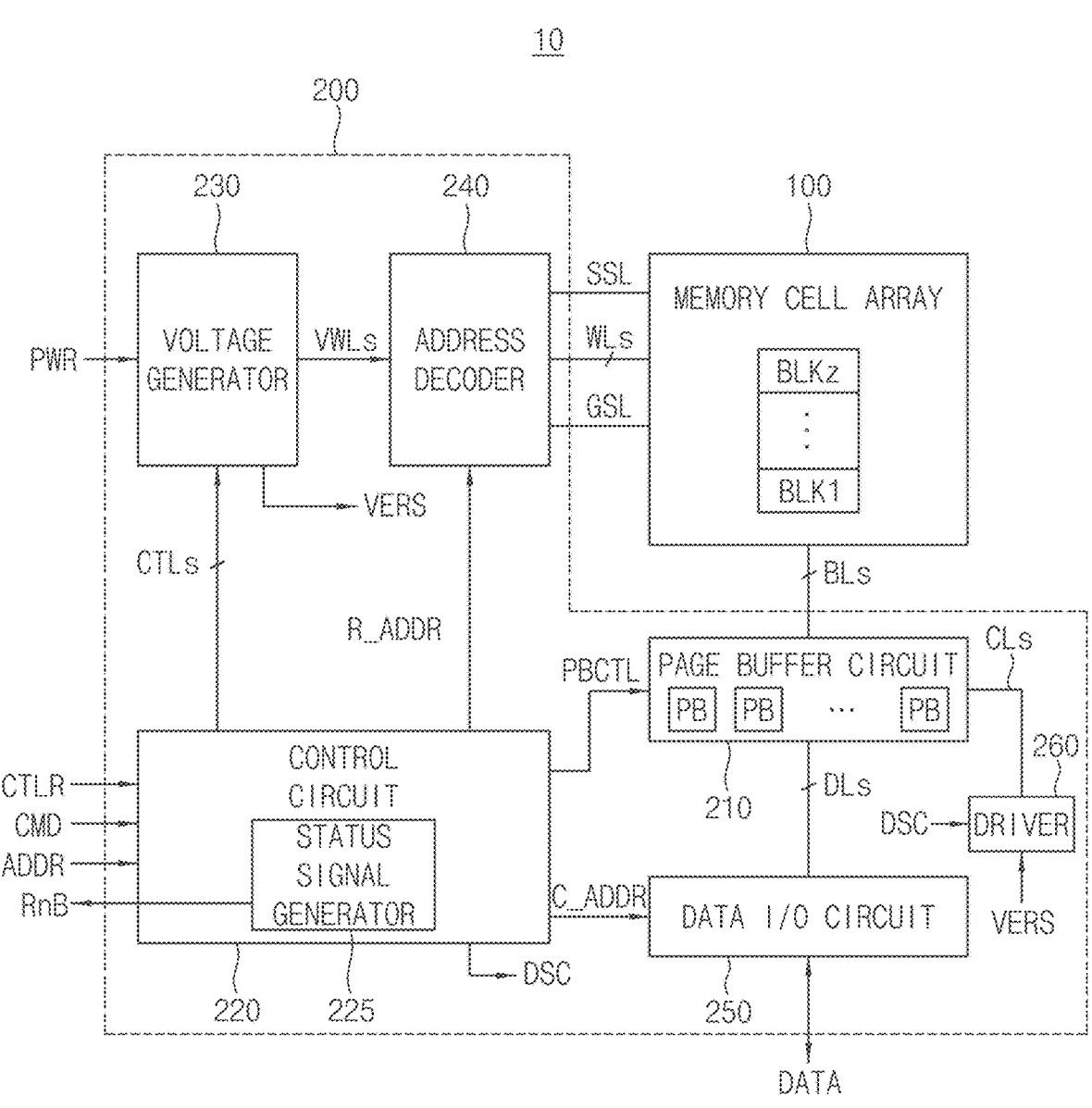
FIG. 8 is a block diagram of a nonvolatile memory device according to example embodiments.
Figure 10:
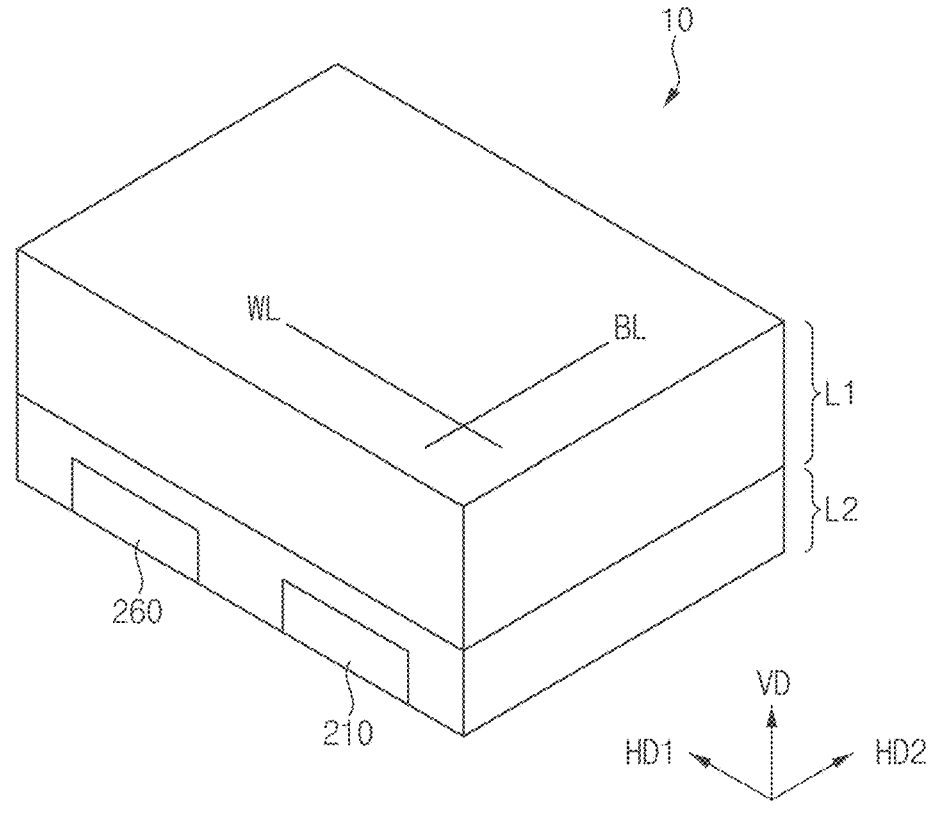
FIG. 10 schematically illustrates a structure of the nonvolatile memory device of FIG. 8 according to some example embodiments.

Referring to FIGS. 1, 8 and 10, there is provided a method of manufacturing a nonvolatile memory device 10 including a first semiconductor layer L1 and a second semiconductor layer L2. A plurality of nonvolatile memory cells, a plurality of word-lines WLs and a plurality of bit-lines BLs are provided in the first semiconductor layer L1 and the second semiconductor layer L2 is formed prior to the first semiconductor layer L1. In some example embodiments the second semiconductor layer L2 is below the first semiconductor layer L1. In some example embodiments, the nonvolatile memory device 10 may have a cell-over-periphery (COP) structure.

According to the method, the second semiconductor layer L2 is provided (operation S110).

Circuit elements including a page buffer circuit 210 and at least one driver 260 are provided in the second semiconductor layer L2 by forming semiconductor elements and patterns for wiring the semiconductor elements on a bottom substrate of the second semiconductor layer L2 (operation S130). The at least one driver 260 driver is spaced apart from the page buffer circuit 210. A first test is performed on the circuit elements (operation S150).

A tester such as an automatic test equipment (ATE) (not shown) may determine whether the second semiconductor layer L2 passes a first test based on a result of the first test (operation S410). When the second semiconductor layer L2 does not pass the first test (NO in operation S410), the second semiconductor layer L2 is determined to have at least one defect (operation S430). The at least one defect may not be repairable in some example embodiments.

When the second semiconductor layer L2 passes the first test (YES in operation S410), the first semiconductor layer L1 may be stacked on the second semiconductor layer L2 (operation S420).

A plurality of nonvolatile memory cells, a plurality of word-lines WLs and a plurality of bit-lines BLs are provided in the first semiconductor layer L1 (operation S440). At least some of the plurality of word-lines WLs and the plurality of bit-lines BL are connected to the circuit elements in the second semiconductor layer L2 by through vias such as through-silicon vias (TSVs) or through-hole vias formed after the plurality of nonvolatile memory cells, the plurality of word-lines WLs and the plurality of bit-lines BLs are provided in the first semiconductor layer L1.

A second test is performed on the plurality of nonvolatile memory cells, the plurality of word-lines WLs and the plurality of bit-lines BL (operation S450).

A tester such as an automatic test equipment (ATE) (not shown) may determine whether the first semiconductor layer L1 passes the second test based on a result of the second test (operation S460). When the first semiconductor layer L1 passes the second test (YES in operation S460), the nonvolatile memory device 10 may be deemed as a good product (operation S470). When the first semiconductor layer L1 does not pass the second test (NO in operation S460), at least one defect of the nonvolatile memory device 10 may be repaired (operation S480) and the nonvolatile memory device 10 may be deemed as a good product (operation S470). In some example embodiments the nonvolatile memory device 10 may not be repairable; however, example embodiments are not limited thereto.

FIG. 2 is a flow chart illustrating example operations of a first test on the circuit elements in FIG. 1 according to some example embodiments.

For convenience of explanation, operations of the first test will be explained with reference to FIGS. 2, 8 and 16.

Figure 16:
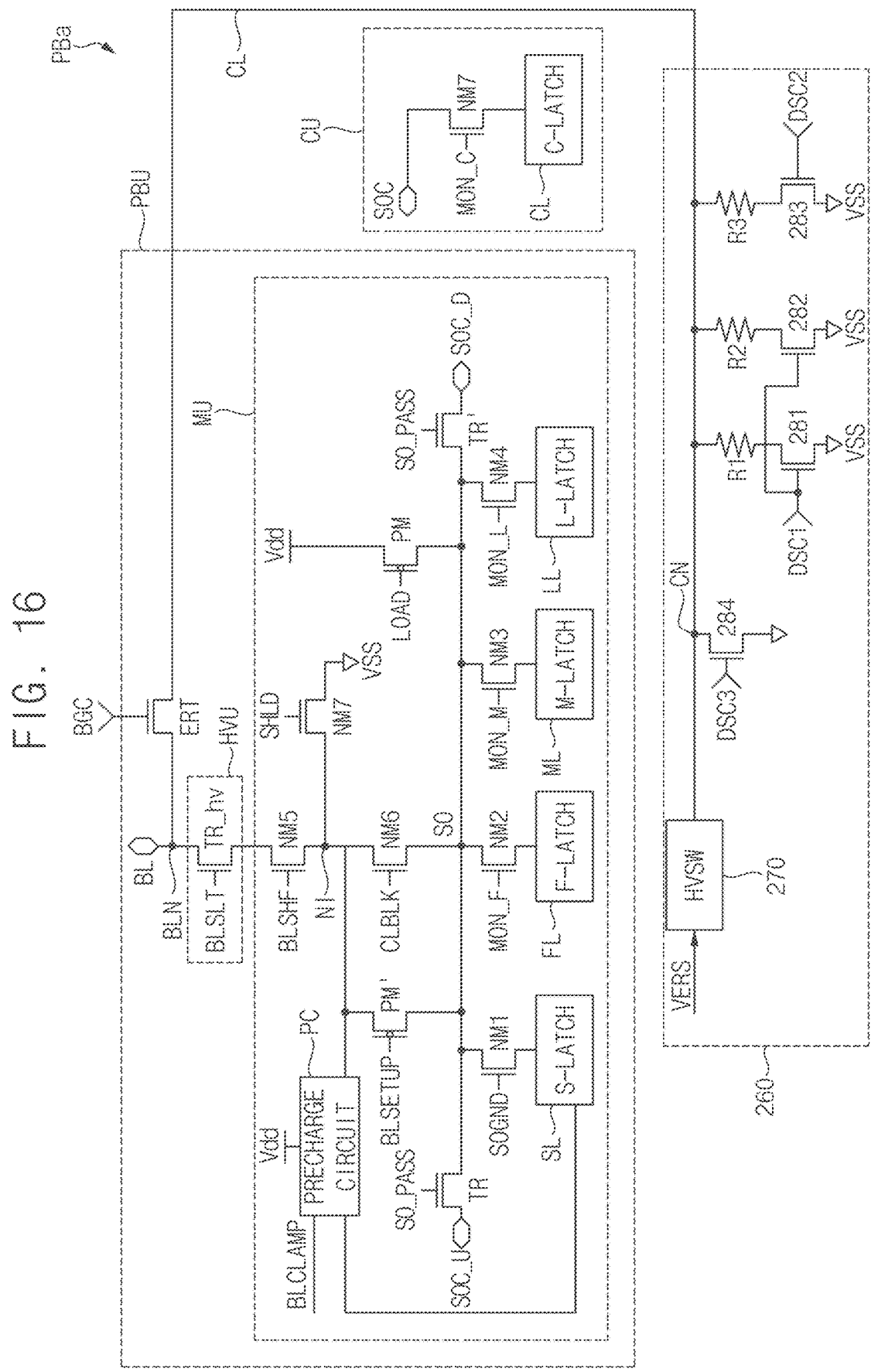
FIG. 16 illustrates a page buffer and at least one driver in the nonvolatile memory device of FIG. 8 according to some example embodiments.

Referring to FIGS. 2, 8 and 16, for performing the first test on the circuit elements (operation S150), an on-state of memory cells which are not connected to the page buffer circuit 210 is mimicked by providing at least one discharging path between a sensing node SO and a plurality of discharge transistors 281, 282 and 283 of the driver 260 (operation S200). The driver 260 is a connected to a connection transistor ERT coupled to a bit-line node BLN of the page buffer circuit 210 (or a page buffer PB a) through a conduction line CL.

A sensing and latching operation is performed in the page buffer circuit 210, with the on-state being mimicked (operation S310). A tester such as an automatic test equipment (ATE) (not shown) may determine whether the page buffer circuit 210 operates normally based on a result of the sensing and latching operation (operation S350).

A tester such as an automatic test equipment (ATE) (not shown) may determine whether each of other circuit elements operates normally after determining whether the page buffer circuit 210 operates normally.

FIG. 3A is a flow chart illustrating detailed operations of mimicking the on-state in FIG. 2 according to some example embodiments.

For convenience of explanation, operations of mimicking the on-state will be explained with reference to FIGS. 3A and 16.

Figure 12:
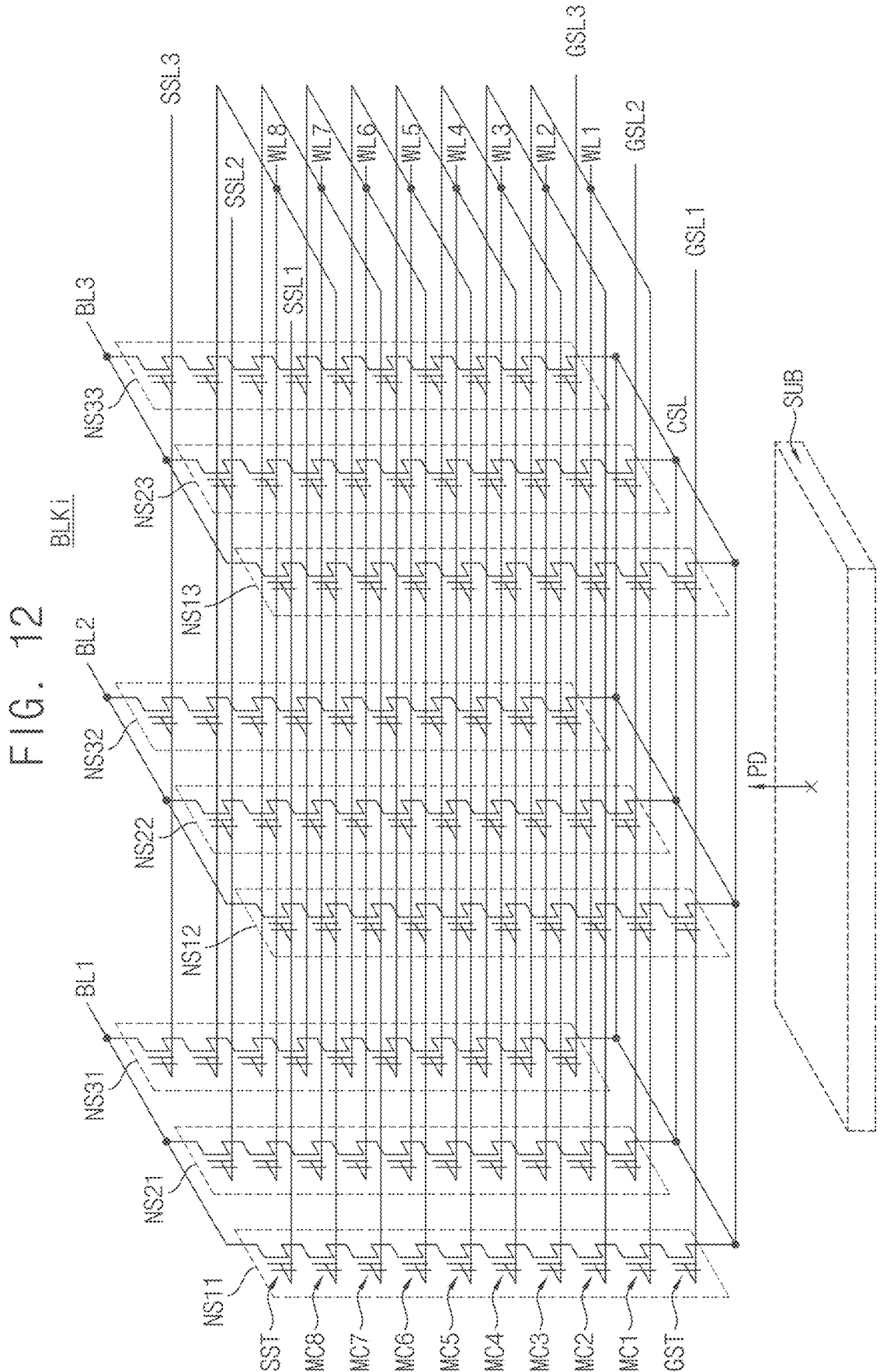
FIG. 12 is a circuit diagram illustrating one of the memory blocks of FIG. 11.

Referring to FIGS. 3A and 12, for mimicking the on-state (S200a), the sensing node SO is pre-charged to a level of a power supply voltage VDD (operation S212). A current supply to the sensing node SO is interrupted (operation S214). At least one of the plurality of discharge transistors 281, 282 and 283 may be turned on during a first time interval (operation S220), and the on-state of memory cells is mimicked by providing at least one discharging path between the sensing node SO and plurality of discharge transistors 281, 282 and 283.

FIG. 3B is a flow chart illustrating detailed operations of performing the sensing and latching operation in FIG. 2 according to some example embodiments.

For convenience of explanation, operations of performing sensing and latching operation will be explained with reference to FIGS. 3B and 16.

Referring to FIGS. 3B and 16, for performing sensing and latching operation (operation S310a), the at least one discharge transistor that is turned on is turned off (operation S311) and thus the at least one discharging path is interrupted. A voltage level of the sensing node SO is latched (operation S312) and it is determined if the page buffer circuit 210 operates normally based on latched voltage level.

FIG. 4 illustrates an example operation of turning on the at least one discharge transistor in FIG. 3A according to some example embodiments.

For convenience of explanation, FIG. 4 will be explained with reference to FIG. 16.

In FIG. 4, k discharge transistors are included in the driver 260. Here, k is a natural number greater than two.

Referring to FIGS. 4 and 16, for turning on the at least one discharge transistor (operation S220a), j discharge transistors from among the k discharge transistors are turned on during the first time interval (operation S222). Here, j is a natural number equal less than or equal to k. Throughout, the term "natural number" may refer to positive integers, such as 1, 2, 3, etc. Throughout, the term "natural number" does not refer to the number zero.

FIG. 5 illustrates an example operation of turning on the at least one discharge transistor in FIG. 3A according to some example embodiments.

For convenience of explanation, FIG. 5 will be explained with reference to FIG. 16.

In FIG. 5, k discharge transistors are included in the driver 260. Here, k is a natural number greater than two.

Referring to FIGS. 5 and 16, for turning on the at least one discharge transistor (operation S220b), the k discharge transistors are turned on during the first time interval (operation S224).

As described with reference to FIGS. 4 and 5, a time interval of the sensing node SO arriving at a trip level may be adjusted by adjusting a number of discharge transistors that are turned on during the first time interval from among the k discharge transistors.

FIG. 6A is a flow chart illustrating detailed operations of mimicking the on-state in FIG. 2 according to some example embodiments.

For convenience of explanation, operations of mimicking the on-state will be explained with reference to FIGS. 6A and 21.

At least one driver includes a first driver 260a and a second driver 260b. The first driver 260a is connected to a first connection transistor ERT1 coupled to a first bit-line node BLN1 of the page buffer circuit 210 through a first conduction line CL1 and the second driver 260b is connected to a second connection transistor ERT2 coupled to a second bit-line node BLN2 of the page buffer circuit 210 through a second conduction line CL2. The first bit-line node BLN1 may be connected to a first sensing node SO1 and the second bit-line node BLN2 may be connected to a second sensing node SO2. The first driver 260a may include a plurality of first discharge transistors 281a, 282a and 283a and the second driver 260b may include a plurality of second discharge transistors 281b, 282b and 283b.

Figure 21:
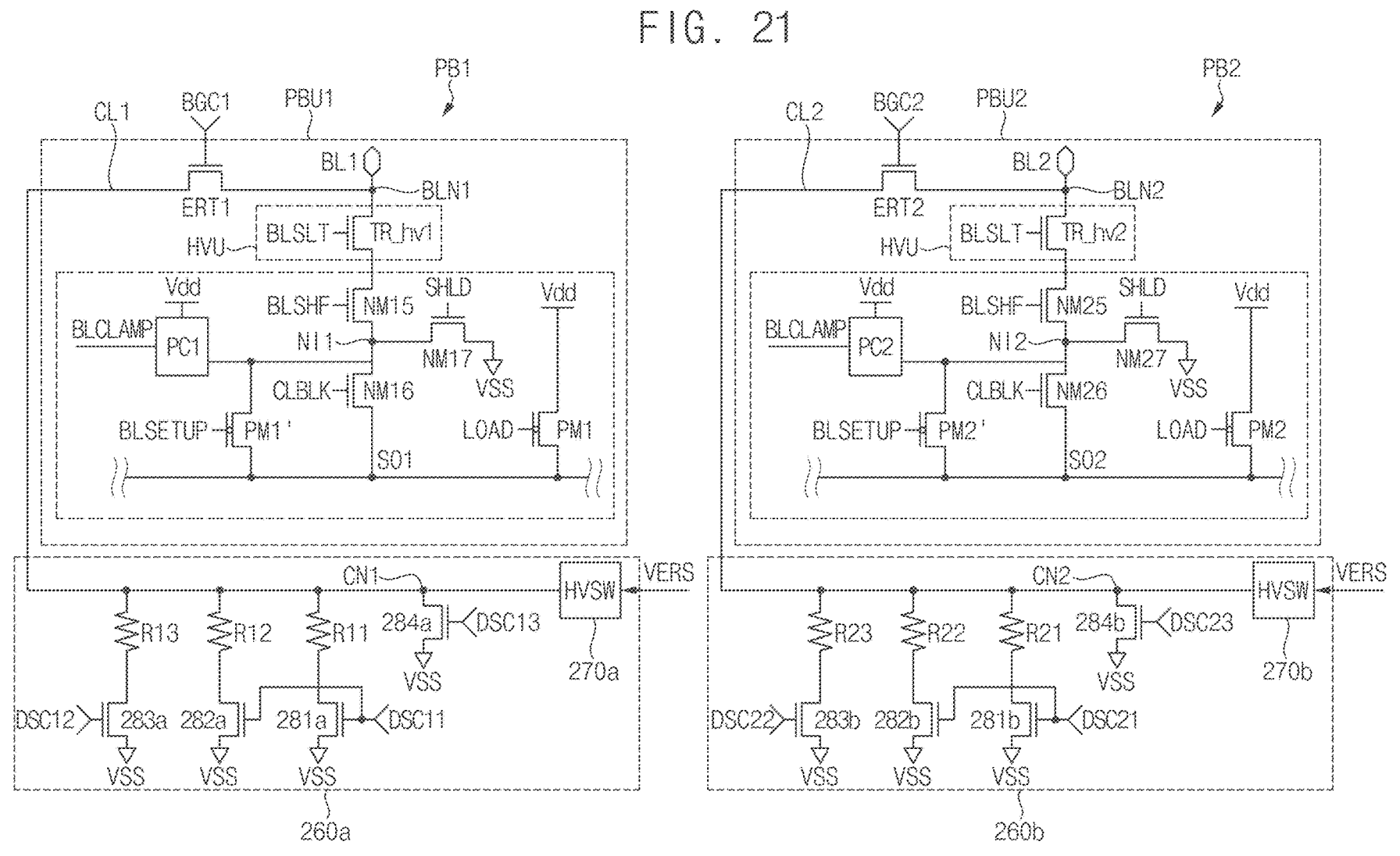

Referring to FIGS. 6A and 21, for mimicking the on-state (S200b), the first sensing node SO1 and the second sensing node SO2 are pre-charged to a level of the power supply voltage VDD (operation S213). A current supply to each of the first sensing node SO1 and the second sensing node SO2 is interrupted (operation S213). At least one of the first discharge transistors 281a, 282a and 283a and at least one of the second discharge transistors 281b, 282b and 283b are turned on during a first time interval (operation S230), and the on-state of memory cells may be mimicked by providing at least one discharging path between the first sensing node SO1 and the first discharge transistors 281a, 282a and 283a and by providing at least one discharging path between the first sensing node SO1 and second discharge transistors 281b, 282b and 283b.

When each of the first discharge transistors 281a, 282a and 283a and the second discharge transistors 281b, 282b and 283b include k discharge transistors, for turning on at least one of the first discharge transistors 281a, 282a and 283a and for at least one of the second discharge transistors 281b, 282b and 283b, j discharge transistors of the first k discharge transistors and i discharge transistors of the second k discharge transistors are turned on during the first time interval. Here, j is a natural number less than or equal to k and i is a natural number less than or equal to k and greater than or equal to j.

FIG. 6B is a flow chart illustrating detailed operations of performing the sensing and latching operation in FIG. 2 according to some example embodiments.

For convenience of explanation, operations of performing sensing and latching operation will be explained with reference to FIGS. 6B and 21.

Referring to FIGS. 6B and 21, for performing sensing and latching operation (operation S310b), the discharge transistors that are turned on is turned off (operation S313) and thus the discharging path are interrupted. A voltage level of each of the first sensing node SO1 and the second sensing node SO2 is latched (operation S314) and it is determined if the page buffer circuit 210 operates normally based on latched voltage level.

FIG. 7A is a flow chart illustrating detailed operations of mimicking the on-state in FIG. 2 according to some example embodiments.

For convenience of explanation, operations of mimicking the on-state will be explained with reference to FIGS. 7A and 21.

It may be assumed that the at least one driver includes a first driver 260a and a second driver 260b. The first driver 260a is connected to a first connection transistor ERT1 coupled to a first bit-line node BLN1 of the page buffer circuit 210 through a first conduction line CL1 and the second driver 260b is connected to a second connection transistor ERT2 coupled to a second bit-line node BLN2 of the page buffer circuit 210 through a second conduction line CL2. The first bit-line node BLN1 may be connected to a first sensing node SO1 and the second bit-line node BLN2 may be connected to a second sensing node SO2. The first driver 260a may include a plurality of first discharge transistors 281a, 282a and 283a and the second driver 260b may include a plurality of second discharge transistors 281b, 282b and 283b.

Referring to FIGS. 7A and 21, for mimicking the on-state (S200c), the first sensing node SO1 and the second sensing node SO2 are pre-charged, e.g. pre-charged concurrently or simultaneously or at least partly concurrently or separately pre-charged, to a level of the power supply voltage VDD (operation S213). A current supply to each of the first sensing node SO1 and the second sensing node SO2 is interrupted (operation S213). The first discharge transistors 281a, 282a and 283a are turned off and at least one of the second discharge transistors 281b, 282b and 283b are turned on during a first time interval (operation S240), and an off-state of memory cells at the first sensing node SO1 and an on-state of memory cells at the second sensing node SO2 are mimicked by interrupting discharging path between the first sensing node SO1 and the first discharge transistors 281a, 282a and 283a and by providing at least one discharging path between the first sensing node SO1 and second discharge transistors 281b, 282b and 283b.

FIG. 7B is a flow chart illustrating detailed operations of performing the sensing and latching operation in FIG. 2 according to some example embodiments.

For convenience of explanation, operations of performing sensing and latching operation will be explained with reference to FIGS. 7B and 21.

Referring to FIGS. 7B and 21, for performing sensing and latching operation (operation S310c), the at least one discharge transistor that is turned on is turned off (operation S315) and thus the discharging path are interrupted. A voltage level of each of the first sensing node SO1 and the second sensing node SO2 is latched (operation S316) and it is determined if the page buffer circuit 210 operates normally based on latched voltage level with the off-state and the on-state being mimicked.

FIG. 8 is a block diagram of a nonvolatile memory device according to various example embodiments.

Referring to FIG. 8, the nonvolatile memory device 10 may include a memory cell array 100 and a peripheral circuit 200. The peripheral circuit 200 may include a page buffer circuit 210, a control circuit 220, a voltage generator 230, an address decoder 240, a data input/output (I/O) circuit 250 and at least one driver 260. Although not illustrated in FIG. 8, the peripheral circuit 200 may further include an I/O interface, a column logic, a pre-decoder, a temperature sensor, a command decoder, etc.

The memory cell array 100 may be coupled to the address decoder 240 through a string selection line SSL, a plurality of word-lines WLs, and a ground selection line GSL. In addition, the memory cell array 100 may be coupled to the page buffer circuit 210 through a plurality of bit-lines BLs.

The memory cell array 100 may include a plurality of nonvolatile memory cells coupled to the plurality of word-lines WLs and the plurality of bit-lines BLs. The nonvolatile memory cells may be single-level cells (SLC), or may be cells capable of storing more than one bit of information, such as multi-level cells (MLC). Example embodiments are not limited thereto.

The memory cell array 100 may include a plurality of memory blocks BLK1 through BLKz, and each of the memory blocks BLK1 through BLKz may have a three-dimensional (3D) structure. The memory cell array 100 may include a plurality of memory cell strings and each of the vertical cell strings includes a plurality of memory cells stacked with respect to each other. The memory cell strings may be referred to as NAND cell strings or cell strings.

The control circuit 220 may receive one or more of a command CMD, an address ADDR, and a control signal CTRL from a memory controller (20 in FIG. 9) and may control one or more of an erase loop, a program loop and a read operation of the nonvolatile memory device 10 based on the command CMD, the address ADDR, and the control signal CTRL.

In some example embodiments, the control circuit 220 may generate control signals CTLs, which are used for controlling the voltage generator 230, based on the command CMD, generate a page buffer control signal PBCTL for controlling the page buffer circuit 210, generate a discharge control signal DSC for controlling the driver 260 and generate a row address R_ADDR and a column address C_ADDR based on the address ADDR. The control circuit 220 may provide the control signals CTLs to the voltage generator 230 may provide the page buffer control signal PBCTL to the page buffer circuit 210 and may provide the discharge control signal DSC to the driver 260. Alternatively or additionally, the control circuit 220 may provide the row address R_ADDR to the address decoder 240 and provide the column address C_ADDR to the data I/O circuit 250. The control circuit 220 may include a status signal generator 225 and the status signal generator 225 may generate a status signal RnB indicating an operating status of the nonvolatile memory device 10. The status signal RnB may be referred to as a ready/busy signal because of the status signal RnB indicates either busy state or a ready state of the nonvolatile memory device 10.

The address decoder 240 may be coupled to the memory cell array 100 through the string selection line SSL, the plurality of word-lines WLs, and the ground selection line GSL. During program operation and/or read operation, the address decoder 240 may determine one of the plurality of word-lines WLs as a selected word-line based on the row address R_ADDR and may determine rest of the plurality of word-lines WLs except the selected word-line as unselected word-lines.

The voltage generator 230 may generate word-line voltages VWL and an erase voltage VERS associated with operations of the nonvolatile memory device 10 by using a power PWR provided from the memory controller 20 and based on control signals CTLs from the control circuit 220. The word-line voltages VWLs may include one or more of a program voltage, a read voltage, a pass voltage, an erase verification voltage, or a program verification voltage. The word-line voltages VWL may be provided to the plurality of word-lines WLs through the address decoder 240 and the erase voltage VERS may be provided to the page buffer circuit 210 through the driver 260.

For example, during an erase operation, the voltage generator 230 may apply the erase voltage VERS to the plurality of bit-lines BLs through connection transistors of the page buffer circuit 210 and may apply a ground voltage to all word-lines of a memory block. During the erase verification operation, the voltage generator 230 may apply erase verification voltage to all word-lines of the memory block or may apply the erase verification voltage to the word-lines of the memory block by word-line basis. When the erase voltage VERS is applied to the plurality of bit-lines BLs, electron-hole pairs (EHPs) may be produced in a vertical channel through gate induced drain leakage (GIDL) phenomenon. The electrons may be attracted toward and moved toward a gate of the connection transistor and the holes may be supplied to the vertical channel. Thus, it may be possible to more effectively provide the holes into charge storing layers from the vertical channel, during the erase operation, and memory cells of the cell strings may be erased.

For example, during the program operation, the voltage generator 230 may apply a program voltage to the selected word-line and may apply a program pass voltage to the unselected word-lines. Alternatively or additionally, during the program verification operation, the voltage generator 230 may apply a program verification voltage to the selected word-line and may apply a verification pass voltage to the unselected word-lines. Alternatively or additionally, during the read operation, the voltage generator 230 may apply a read voltage to the selected word-line and may apply a read pass voltage to the unselected word-lines.

The page buffer circuit 210 may be coupled to the memory cell array 100 through the plurality of bit-lines BLs. The page buffer circuit 1 410 may include a plurality of page buffers PB. The page buffer circuit 210 may temporarily store data to be programmed in a selected page or data read out from the selected page of the memory cell array 100.

Figure 15:
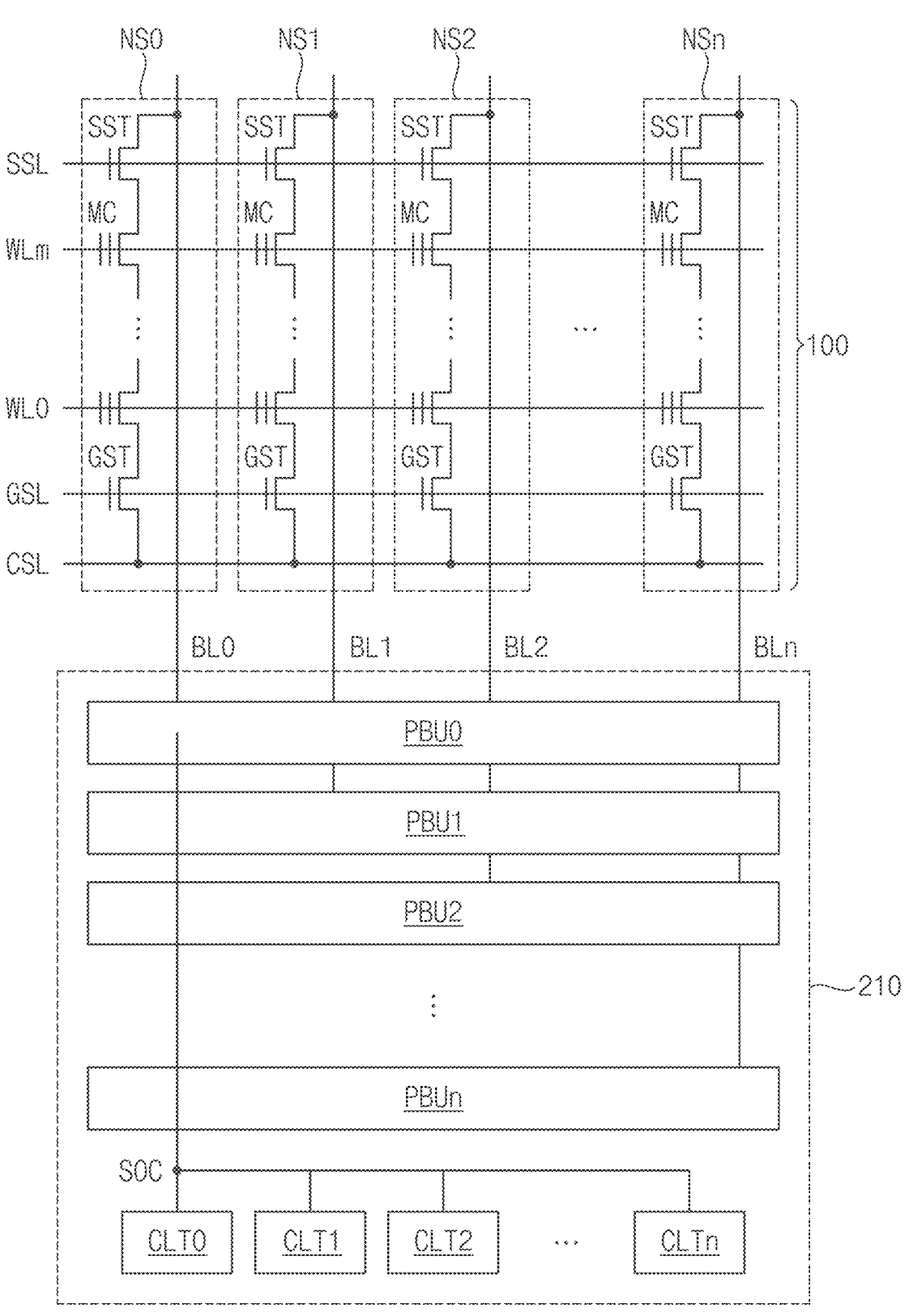
FIG. 15 is a schematic diagram of a connection of the memory cell array to the page buffer circuit in FIG. 8, according to some example embodiments.

In some example embodiments, page buffer units included in each of the plurality of page buffers PB (for example, first through (n+1)th page buffer units PBU0 through PBUn in FIG. 15) and cache latches included in each of the plurality of page buffers PB (for example, first through (n+1)th cache latches CLT0 through CLTn in FIG. 15) may be apart from each other, and have separate structures. Accordingly, the degree of freedom of wirings on the page buffer units may be improved, and/or the complexity of a layout may be reduced. Alternatively or additionally, because the cache latches are adjacent to the data I/O lines, the distance between the cache latches and the data I/O lines may be reduced, and thus, data I/O speed may be improved.

The data I/O circuit 250 may be coupled to the page buffer circuit 210 through data lines DLs. During the program operation, the data I/O circuit 250 may receive program data DATA from the memory controller (20 in FIG. 9) and provide the program data DATA to the page buffer circuit 210 based on the column address C_ADDR received from the control circuit 220. During the read operation, the data I/O circuit 250 may provide read data DATA to the memory controller 20 based on the column address C_ADDR received from the control circuit 220.

The driver 260 may be connected to each of the plurality of page buffers PB through conduction lines CLs and may provide the erase voltage VRES to each of the cell strings through a bit-line node of each of the plurality of page buffers PB during the erase operation. The driver 260 may provide at least one discharging path between the page buffer circuit 210 and a ground voltage in response to the discharge control signal DSC.

The manufacturing and/or testing method described with reference to FIGS. 1 through 7B may be applied to the nonvolatile memory device 10 of FIG. 8. The peripheral circuit 200 is provided in the second semiconductor layer (L2 in FIG. 10) and the memory cell array 100 is stacked on the semiconductor layer (L2 in FIG. 10) after the second semiconductor layer (L2 in FIG. 10) passes the first test.

Alternatively or additionally, when the first test is performed on peripheral circuit 200 with the memory cell array 100 not being connected to the peripheral circuit 200, a result of the first test may be provided to an external test device.

Figure 9:
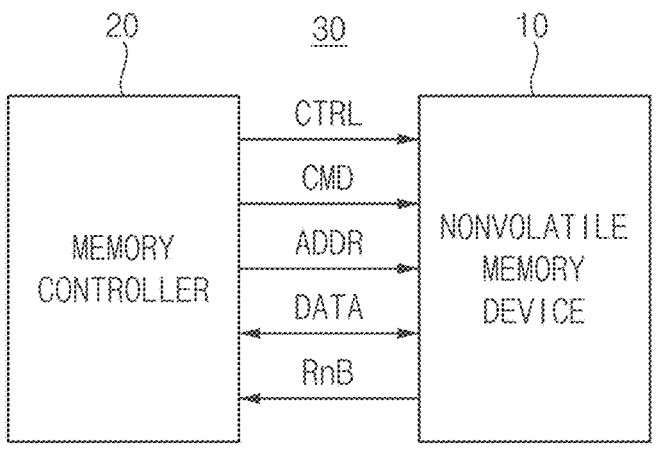
FIG. 9 is a block diagram illustrating a memory system including the nonvolatile memory device of FIG. 8 according to some example embodiments.

FIG. 9 is a block diagram illustrating a memory system including the nonvolatile memory device of FIG. 8 according to some example embodiments.

Referring to FIG. 9, a memory system 30 may include a memory controller 20 and the nonvolatile memory device 10.

The memory controller 20 may control operation of the nonvolatile memory device 10 by applying control signal CTRL, the command CMD and address ADDR to the nonvolatile memory device 10 may exchange the data DATA with the nonvolatile memory device 10. The nonvolatile memory device 10 may provide the status signal RnB indicating operating status of the nonvolatile memory device 10. For example, when the status signal RnB has a logic high level (ready state), the status signal RnB indicates that the nonvolatile memory device 10 is ready for receiving a command from the memory controller 20.

FIG. 10 schematically illustrates a structure of the nonvolatile memory device of FIG. 8 according to some example embodiments.

Referring to FIG. 10, the nonvolatile memory device 10 may include a first semiconductor layer L1 and a second semiconductor layer L2, and the first semiconductor layer L1 may be stacked in a vertical direction VD with respect to the second semiconductor layer L2. The second semiconductor layer L2 may be under or below the first semiconductor layer L1 in the vertical direction VD, and accordingly, the second semiconductor layer L2 may be closer to a substrate.

In some example embodiments, the memory cell array 100 in FIG. 8 may be formed (or, provided) on the first semiconductor layer L1, and the peripheral circuit 200 in FIG. 8 may be formed (or, provided) on the second semiconductor layer L2. Accordingly, the nonvolatile memory device 10 may have a structure in which the memory cell array 100 is on the peripheral circuit 200, for example, a cell over periphery (COP) structure. The COP structure may more effectively reduce an area in a horizontal direction and improve the degree of integration of the nonvolatile memory device 10. The page buffer circuit 210 and the driver 260 may be formed (or, provided) on the second semiconductor layer L2.

In some example embodiments, the second semiconductor layer L2 may include the substrate, and by forming transistors on the substrate and metal patterns for wiring transistors, the peripheral circuit 200 may be formed in the second semiconductor layer L2. After the peripheral circuit 200 is formed on the second semiconductor layer L2, the first semiconductor layer L1 including the memory cell array 100 may be formed, and metal patterns for connecting the word-lines WL and the bit-lines BL of the memory cell array 100 to the peripheral circuit 200 formed in the second semiconductor layer L2 may be formed. For example, the word-lines WL may extend in a first horizontal direction HD1 and the bit-lines BL may extend in a second horizontal direction HD2.

As the number of stages of memory cells in the memory cell array 100 increases with the development of semiconductor processes, for example, as the number of stacked word-lines WL increases, an area of the memory cell array 100 may decrease, and accordingly, an area of the peripheral circuit 200 may also be reduced. According to some example embodiments, to reduce an area of a region occupied by the page buffer circuit 210, the page buffer circuit 210 may have a structure in which the page buffer unit and the cache latch are separated from each other, and may connect sensing nodes included in each of the page buffer units commonly to a combined sensing node. This will be explained in more detail with reference to FIG. 15.

Figure 11:
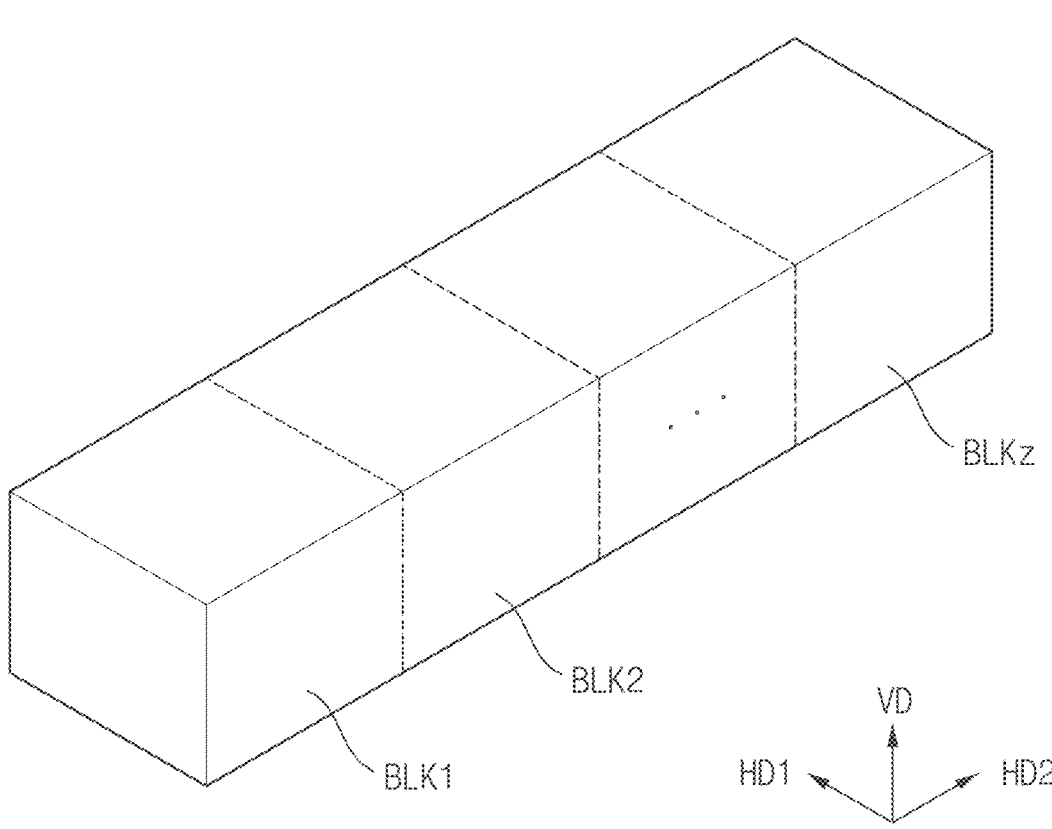
FIG. 11 is a block diagram illustrating an example of the memory cell array in FIG. 8 according to some example embodiments.

FIG. 11 is a block diagram illustrating an example of the memory cell array in FIG. 8 according to some example embodiments.

Referring to FIG. 11, the memory cell array 100 may include a plurality of memory blocks BLK1 to BLKz which extend along a plurality of directions HD1, HD2 and VD. Here, z is a natural number greater than two. In an embodiment, the memory blocks BLK1 to BLKz are selected by the address decoder 240 in FIG. 8. For example, the address decoder 240 may select a memory block BLK corresponding to a block address among the memory blocks BLK1 to BLKz.

FIG. 12 is a circuit diagram illustrating one of the memory blocks of FIG. 11.

The memory block BLKi of FIG. 12 may be formed on a substrate SUB in a three-dimensional structure (or a vertical structure). For example, a plurality of memory cell strings included in the memory block BLKi may be formed in a direction PD perpendicular to the substrate SUB.

Referring to FIG. 12, the memory block BLKi may include cell strings NS11 to NS33 coupled between bit-lines BL1, BL2 and BL3 and a common source line CSL. Each of the cell strings NS11 to NS33 may include a string selection transistor SST, a plurality of memory cells MC1 to MC8, and a ground selection transistor GST. In FIG. 12, each of the cell strings NS11 to NS33 is illustrated to include eight memory cells MC1 to MC8. However, example embodiments are not limited thereto. In some example embodiments, each of the cell strings NS11 to NS33 may include any number of memory cells, e.g. more than eight, such as 12, 16, 20, 24, 28, or 32, or less than eight, such as four.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated.

Figure 13:
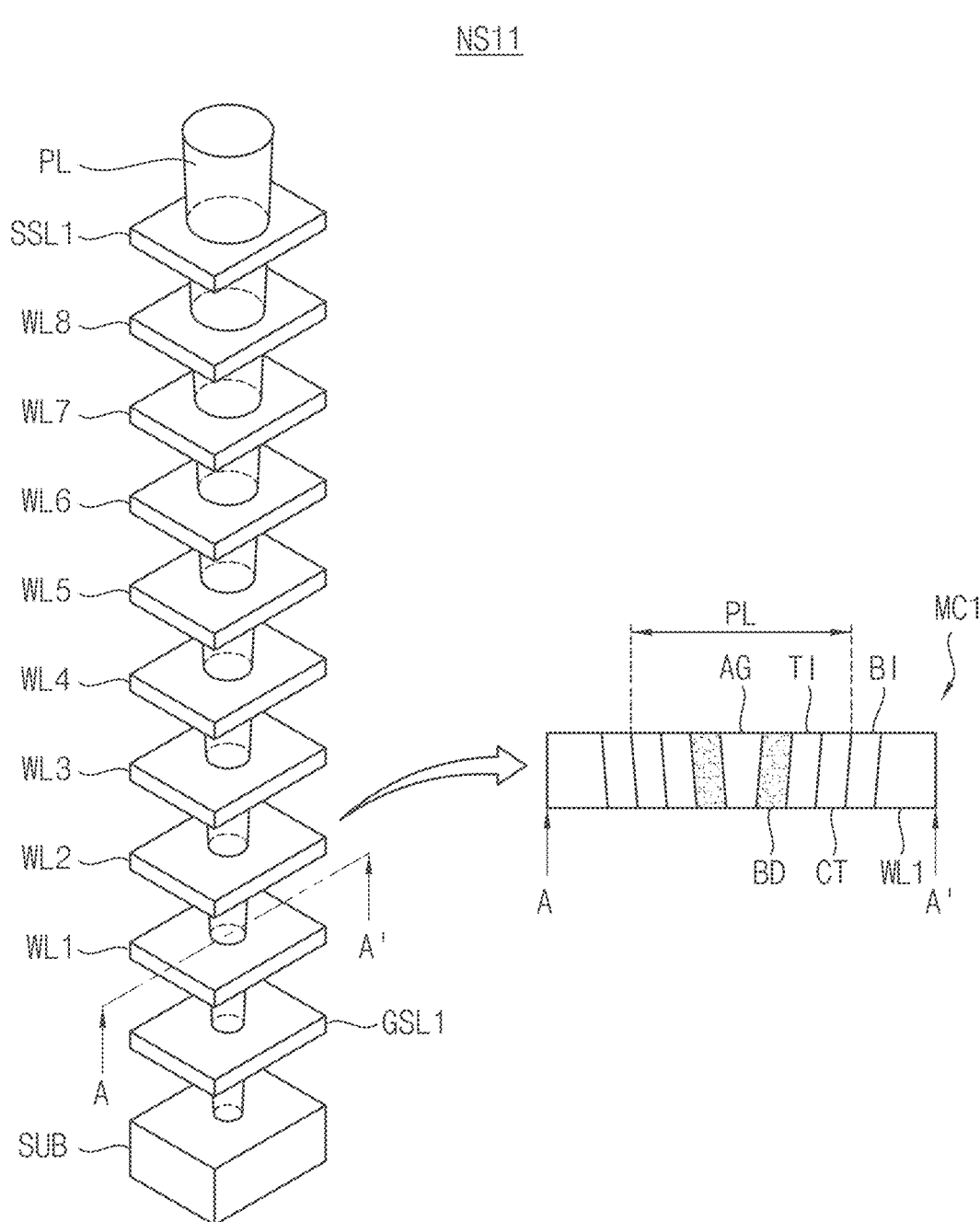
FIG. 13 illustrates an example of a structure of a cell string in the memory block of FIG. 12.

FIG. 13 illustrates an example of a structure of a cell string CS in the memory block of FIG. 12.

Referring to FIGS. 12 and 13 a pillar PL is provided on the substrate SUB such that the pillar PL extends in a direction perpendicular to the substrate SUB to make contact with the substrate SUB. Each of the ground selection line GSL, the word-lines WL1 to WL8, and the string selection lines SSL illustrated in FIG. 13 may be formed of or may include a conductive material parallel with the substrate SUB, for example, a metallic material. The pillar PL may be in contact with the substrate SUB through the conductive materials forming the string selection lines SSL, the word-lines WL1 to WL8, and the ground selection line GSL.

A sectional view taken along a line A-A' is also illustrated in FIG. 13. In some example embodiments, a sectional view of a first memory cell MC1 corresponding to a first word-line WL1 is illustrated. The pillar PL may include a cylindrical body BD and/or a tapered cylindrical body. An air gap AG may be defined in the interior of the body BD. The air gap may include air, such as clean, dry air (CDA), or may be under vacuum; example embodiments are not limited thereto.

The body BD may include P-type silicon such as doped polysilicon, and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Figure 14A:
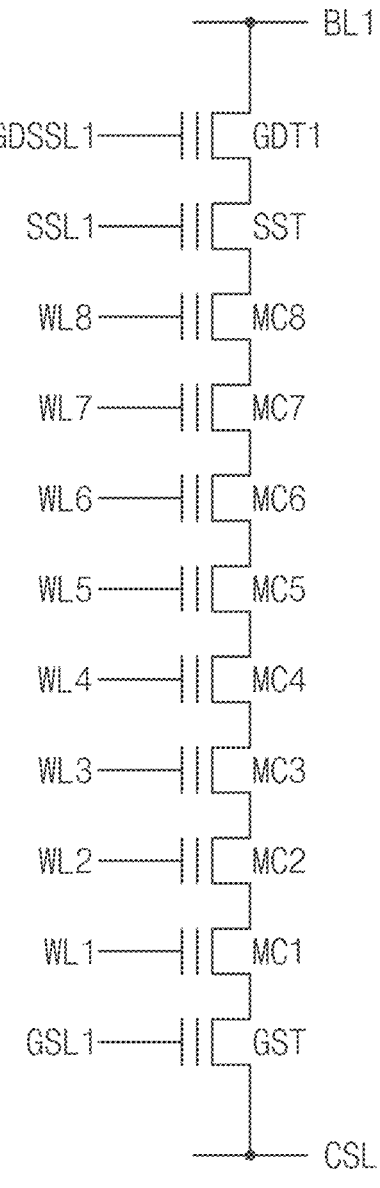
FIGS. 14A through 14C illustrate examples of one of cell strings in FIG. 12, respectively, according to some example embodiments.
Figure 14B:
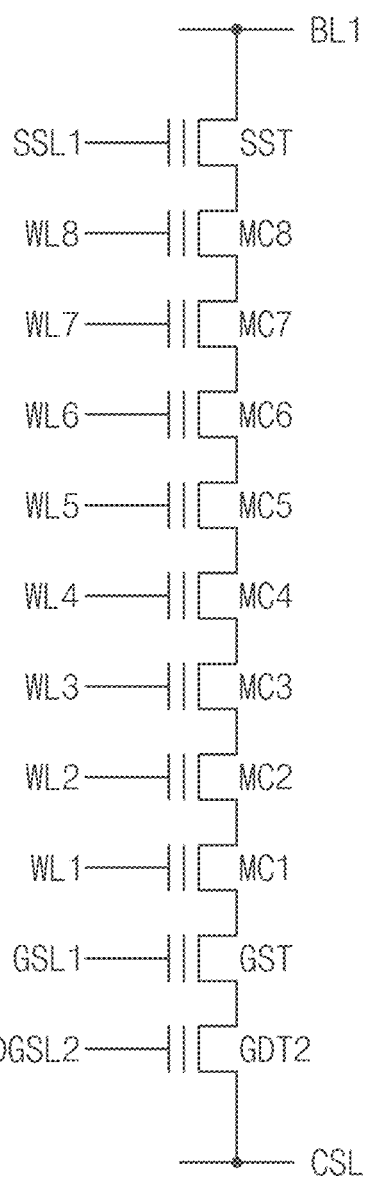
Figure 14C:
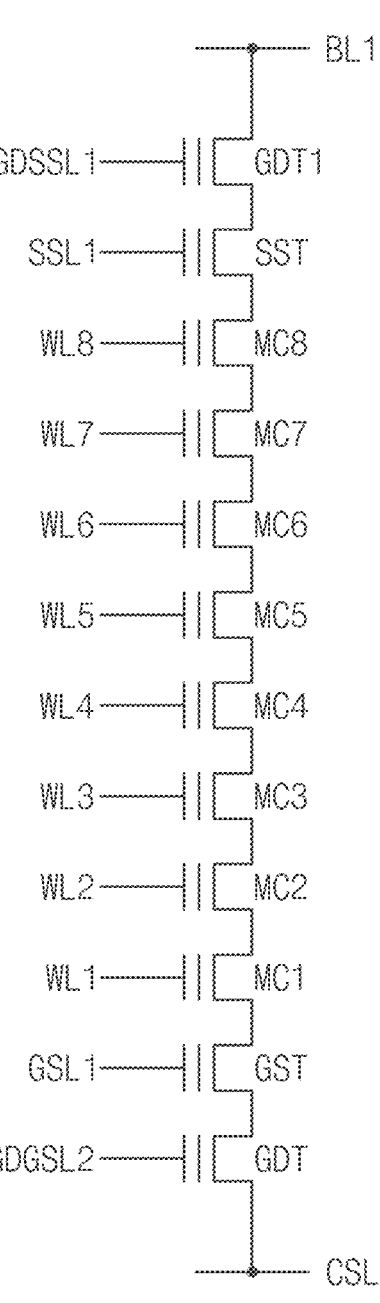

FIGS. 14A through 14C illustrate examples of one of cell strings in FIG. 12, respectively, according to some example embodiments.

Referring to FIG. 14A, a cell string NS11a may include a ground selection transistor GST, a plurality of memory cells MC1 to MC8, a string selection transistor SST and a gate induced drain leakage (GIDL) string selection transistor GDT1 connected in series between the common source line CSL and the bit-line BL1.

The GIDL string selection transistor GDT1 may be coupled to a GIDL string selection line GDSSL1. In this case, a uni-directional channel precharge may be performed in each of the cell strings during the bit-line set-up period PBLS, by applying a GIDL drain voltage to all or some of the plurality of bit-lines such that the GIDL drain voltage has a voltage level higher than a voltage difference between a GIDL threshold voltage and a GIDL on voltage. The GIDL on voltage correspond to a voltage having a level to turn-on the GIDL string selection transistor GDT1. Each of the memory cell strings NS11 to NS33 in FIG. 12 may employ the cell string NS11a of FIG. 14A.

Referring to FIG. 14B, a cell string NS11b may include a GIDL ground selection transistor GDT2, a ground selection transistor GST, a plurality of memory cells MC1 to MC8 and a string selection transistor SST connected in series between the common source line CSL and the bit-line BL1. The GIDL ground selection transistor GDT2 may be coupled to a GIDL ground selection line GDGSL2. In this case, a uni-directional channel precharge may be performed in each of the cell strings, by applying a GIDL drain voltage to the common source line CSL. Each of the memory cell strings NS11 to NS33 in FIG. 12 may employ the cell string NS11b of FIG. 14B.

Referring to FIG. 14C, a cell string NS11c may include a GIDL ground selection transistor GDT2, a ground selection transistor GST, a plurality of memory cells MC1 to MC8, a string selection transistor SST and a GIDL string selection transistor GDT1 connected in series between the common source line CSL and the bit-line BL1. The GIDL ground selection transistor GDT2 may be coupled to a GIDL ground selection line GDGSL2 and the GIDL string selection transistor GDT1 may be coupled to a GIDL string selection line GDSSL1. In this case, a bi-directional channel precharge may be performed in each of the cell strings, by applying the GIDL drain voltage to at least a portion of the plurality of bit-lines and applying the GIDL drain voltage to common the source line CSL. Each of the memory cell strings NS11 to NS33 in FIG. 12 may employ the cell string NS11c of FIG. 14C.

FIG. 15 is a schematic diagram of a connection of the memory cell array to the page buffer circuit in FIG. 8, according to some example embodiments.

Referring to FIG. 15, the memory cell array 100 may include first through (n+1)th NAND strings NS0 through NSn, each of the first through (n+1)th cell strings NS0 through NSn may include a ground select transistor GST connected to the ground select line GSL, a plurality of memory cells MC respectively connected to the first through (m+1)th word-lines WL0 through WLm, and a string select transistor SST connected to the string select line SSL, and the ground select transistor GST, the plurality of memory cells MC, and the string select transistor SST may be connected to each other in series. In this case, m may be a positive integer.

The page buffer circuit 210 may include first through (n+1)th page buffer units PBU0 through PBUn. The first page buffer unit PB0 may be connected to the first cell string NS0 via the first bit-line BL0, and the (n+1)th page buffer unit PBUn may be connected to the (n+1)th cell string NSn via the (n+1)th bit-line BLn. In this case, n may be a positive integer greater than or equal to one. For example, n may be 7, and the page buffer circuit 210 may have a structure in which page buffer units of eight stages, or, the first through (n+1)th page buffer units PBU0 through PBUn are in a line. For example, the first through (n+1)th page buffer units PBU0 through PBUn may be in a row in an extension direction of the first through (n+1)th bit-lines BL0 through BLn.

The page buffer circuit 210 may further include first through (n+1)th cache latches CLT0 through CLTn respectively corresponding to the first through (n+1)th page buffer units PBU0 through PBUn. For example, the page buffer circuit 210 may have a structure in which the cache latches of eight stages or the first through (n+1)th cache latches CLT0 through CLTn in a line. For example, the first through (n+1)th cache latches CLT0 through CLTn may be in a row in an extension direction of the first through (n+1)th bit-lines BL0 through BLn.

The sensing nodes of each of the first through (n+1)th page buffer units PBU0 through PBUn may be commonly connected to a combined sensing node SOC. In addition, the first through (n+1)th cache latches CLT0 through CLTn may be commonly connected to the combined sensing node SOC. Accordingly, the first through (n+1)th page buffer units PBU0 through PBUn may be connected to the first through (n+1)th cache latches CLT0 through CLTn via the combined sensing node SOC.

Although the memory cell array 100 is illustrated as to be connected to the page buffer circuit 210 for convenience of explanation in FIG. 15, a first test is performed on the page buffer circuit 210 with the memory cell array 100 not being connected to the page buffer circuit 210 and the memory cell array 100 is connected to the page buffer circuit 210 after the first test is performed on the page buffer circuit 210.

FIG. 16 illustrates a page buffer and at least one driver in the nonvolatile memory device of FIG. 8 according to some example embodiments.

Referring to FIG. 16, the page buffer PBa may correspond to an example of the page buffer PB in FIG. 8. The page buffer PBa may include a page buffer unit PBU and a cache unit CU. Because the cache unit CU includes a cache latch (C-LATCH) CLT, and the C-LATCH CLT is connected to a data input/output line, the cache unit CU may be adjacent to the data input/output line. Accordingly, the page buffer unit PBU and the cache unit CU may be apart from each other, and the page buffer PB may have a structure in which the page buffer unit PBU and the cache unit CU are apart from each other.

The page buffer unit PBU may include a main unit MU. The main unit MU may include main transistors in the page buffer PBa. The page buffer unit PBU may further include a connection transistor ERT and a bit-line selection transistor TR_hv that is connected to a bit-line node BLN to which the bit-line BL is to be connected. The bit-line selection transistor TR_hv may be driven by a bit-line selection signal BLSLT. The bit-line selection transistor TR_hv may include a high voltage transistor, and accordingly, the bit-line selection transistor TR_hv may be in a different well region from the main unit MU, that is, in a high voltage unit HVU. The connection transistor ERT may be turned on a connection control signal BGC and may selectively couple the bit-line node BLN to the driver 260. The connection transistor ERT may be an erase transistor that is used for GIDL erase operation.

The main unit MU may include a sensing latch (S-LATCH) SL, a force latch (F-LATCH) FL, an upper bit latch (M-LATCH) ML and a lower bit latch (L-LATCH) LL. According to some example embodiments, the S-LATCH SL, the F-LATCH FL, the M-LATCH ML, or the L-LATCH LL may be referred to as main latches. The main unit MU may further include a precharge circuit PC capable of controlling a precharge operation on the bit-line BL or the sensing node SO based on a bit-line clamping control signal BLCLAMP, and may further include a transistor PM' driven by a bit-line setup signal BLSETUP. The precharge circuit PC may be connected to a power supply voltage Vdd.

The S-LATCH SL may, during a read or program verification operation, store data stored in a memory cell MC or a sensing result of a threshold voltage of the memory cell MC. In addition, the S-LATCH SL may, during a program operation, be used to apply a program bit-line voltage or a program inhibit voltage to the bit-line BL. The F-LATCH FL may be used to improve threshold voltage distribution during the program operation. The F-LATCH FL may store force data. After the force data is initially set to '1', the force data may be converted to '0' when the threshold voltage of the memory cell MC enters a forcing region that has a lower voltage than a target region. By utilizing the force data during a program execution operation, the bit-line voltage may be controlled, and the program threshold voltage distribution may be formed narrower, e.g. to have a narrower distribution and/or a reduced standard deviation.

The M-LATCH ML, the L-LATCH LL, and the C-LATCH CL may be utilized to store data externally input during the program operation, and may be referred to as data latches. When data of 3 bits is programmed in one memory cell MC, the data of 3 bits may be stored in the M-LATCH ML, the L-LATCH LL, and the C-LATCH CL, respectively. Until a program of the memory cell MC is completed, the M-LATCH ML, the L-LATCH LL, and the C-LATCH CL may maintain the stored data. In addition, the C-LATCH CL may receive data read from a memory cell MC during the read operation from the S-LATCH SL, and output the received data to the outside via the data input/output line.

In addition, the main unit MU may further include a number of transistors such as first through fourth transistors NM1 through NM4. The first transistor NM1 may be connected between the sensing node SO and the S-LATCH SL, and may be driven by a ground control signal SOGND. The second transistor NM2 may be connected between the sensing node SO and the F-LATCH FL, and may be driven by a forcing monitoring signal MON_F. The third transistor NM3 may be connected between the sensing node SO and the M-LATCH ML, and may be driven by a higher bit monitoring signal MON_M. The fourth transistor NM4 may be connected between the sensing node SO and the L-LATCH LL, and may be driven by a lower bit monitoring signal MON_L.

In addition, the main unit MU may further include fifth and transistors NM5 and NM6 connected to each other in series between the bit-line selection transistor TV by and the sensing node SO. The fifth transistor NM5 may be referred to as a first n-channel metal-oxide semiconductor (NMOS) transistor. The fifth transistor NM5 has a gate to receive a bit-line shut-off signal BLSHF and may be driven by the bit-line shut-off signal BLSHF. The sixth transistor NM6 may be referred to as a second NMOS transistor. The sixth transistor NM6 has a gate to receive a bit-line connection control signal CLBLK and may be driven by the bit-line connection control signal CLBLK. The fifth transistor NM5 and the sixth transistor NM6 may be connected to each other at an internal node NI. In addition, the main unit MU may further include a seventh transistor NM7 that is connected between the internal node NI and a ground voltage VSS. The seventh transistor NM7 may be referred to as a third NMOS transistor. The seventh transistor NM7 has a gate to receive a shield signal SHLD, may be driven by the shield signal SHLD and may selectively discharge the internal node NI. In addition, the main unit MU may further include a precharge transistor PM. The precharge transistor PM may be referred to as a first p-channel metal-oxide semiconductor (PMOS) transistor. The precharge transistor PM may be connected to the sensing node SO, has a gate to receive a load signal LOAD, is driven by the load signal LOAD, and precharge the sensing node SO to a precharge level in a precharge period. The bit-line selection transistor TV_hv may be referred to as a second PMOS transistor.

In some example embodiments, the main unit MU may further include a pair of pass transistors connected to the sensing node SO, or first and second pass transistors TR and TR'. According to some example embodiment, the first and second pass transistors TR and TR' may also be referred to as first and second sensing node connection transistors, respectively. The first and second pass transistors TR and TR' may be driven in response to a pass control signal SO_PASS. According to some example embodiments, the pass control signal SO_PASS may be referred to as a sensing node connection control signal. The first pass transistor TR may be connected between a first terminal SOC_U and the sensing node SO, and the second pass transistor TR' may be between the sensing node SO and a second terminal SOC_D.

For example, when the page buffer unit PBU corresponds to the second page buffer unit PBU1 in FIG. 15, the first terminal SOC_U may be connected to one end of the pass transistor included in the first page buffer unit PBU0, and the second terminal SOC_D may be connected to one end of the pass transistor included in the third page buffer unit PBU2. In this manner, the sensing node SO may be electrically connected to the combined sensing node SOC via pass transistors included in each of the third through (n+1)th page buffer units PBU2 through PBUn.

During the program operation, the page buffer PB a may verify whether the program is completed in a memory cell MC selected among the memory cells MC included in the NAND string connected to the bit-line BL. The page buffer PBa may store data sensed via the bit-line BL during the program verify operation in the S-LATCH SL. The M-LATCH ML and the L-LATCH LL may be set in which target data is stored according to the sensed data stored in the S-LATCH SL. For example, when the sensed data indicates that the program is completed, the M-LATCH ML and the L-LATCH LL may be switched to a program inhibit setup for the selected memory cell MC in a subsequent program loop. The C-LATCH CLT may temporarily store input data provided from the outside. During the program operation, the target data to be stored in the C-LATCH CLT may be stored in the M-LATCH ML and the L-LATCH LL.

The driver 260 may include a high voltage switch HVSW 270, a plurality of discharge transistors 281, 282, 283 and 284 and a plurality of resistors R1, R2 and R3.

The high voltage switch HVSW 270 may provide the erase voltage VERS to the bit-line node BLN through the conduction line CL.

The plurality of discharge transistors 281, 282, 283 and 284 may be connected in parallel between a connection node CN coupled to the conduction line CL and the ground voltage VSS.

The discharge transistor 281 may be connected between the connection node CN and the ground voltage VSS through the resistor R1, the discharge transistor 282 may be connected between the connection node CN and the ground voltage VSS through the resistor R2, the discharge transistor 283 may be connected between the connection node CN and the ground voltage VSS through the resistor R3 and the discharge transistor 284 may be directly connected between the connection node CN and the ground voltage VSS.

A discharge control signal DSC1 may be applied to each gate of the discharge transistors 281 and 282, a discharge control signal DSC2 may be applied to a gate of the discharge transistor 283 and a discharge control signal DSC3 may be applied to a gate of the discharge transistor 284.

The discharge control signals DSC1, DSC2 and DSC3 may be included in the discharge control signal DSC in FIG. 8.

When the first test is performed on the peripheral circuit 200, the control circuit 220 in FIG. 8 may provide a conducting path between the sensing node SO and the bit-line node BLN by deactivating the shield signal SHLD to turn off the seventh transistor MN7, activating the bit-line connection control signal CLBLK to turn on the sixth transistor NM6, activating the bit-line shut-off signal BLSHF to turn on the fifth transistor NM5 and activating the bit-line selection signal BLSLT to turn on the bit-line selection transistor TR_hv. In addition, the control circuit 220 may provide at least one discharging path among the bit-line node BLN, the conduction line CL and the plurality of discharge transistors 281, 282, 283 and 284 by activating the connection control signal BGC to turn on the connection transistor ERT and by selectively activating each of the discharge control signals DSC1, DSC2 and DSC3 during a first time interval, and thus the on-state of the memory cells with the memory cells not being connected to the bit-line node BLN.

The control circuit 220 may adjust a time interval of the sensing node SO arriving at a trip level by varying a number of discharge transistors that are turned on during the first time interval from among the plurality of discharge transistors 281, 282, 283 and 284.

As a number of discharge transistors that are turned on during the first time interval from among the plurality of discharge transistors 281, 282, 283 and 284 increase, decreasing speed of a voltage level of the sensing node SO may increase and as a number of discharge transistors that are turned on during the first time interval from among the plurality of discharge transistors 281, 282, 283 and 284 decrease, decreasing speed of a voltage level of the sensing node SO may decrease.

Physical properties such as at least one of gate widths, gate lengths, oxide thicknesses, etc., and/or electrical properties such as at least one of threshold voltages, drive currents, on-state resistances, etc. of each of the transistors may be the same as each other, or at least one may be different than at least one other. Furthermore, all of the transistors described may be planar transistors, or all of the transistors described may be three-dimensional transistors, or at least one of the transistors described may be a planar transistor and at least one other may be a three-dimensional transistor.

Hereinafter, assuming that signals for controlling elements in the page buffer circuit 210 are included in the page buffer control signal PBCTL in FIG. 8.

A testing method with reference to FIGS. 2 through 7B may be sequentially performed on a plurality of page buffers such as the page buffer PB of FIG. 16.

Figure 17:
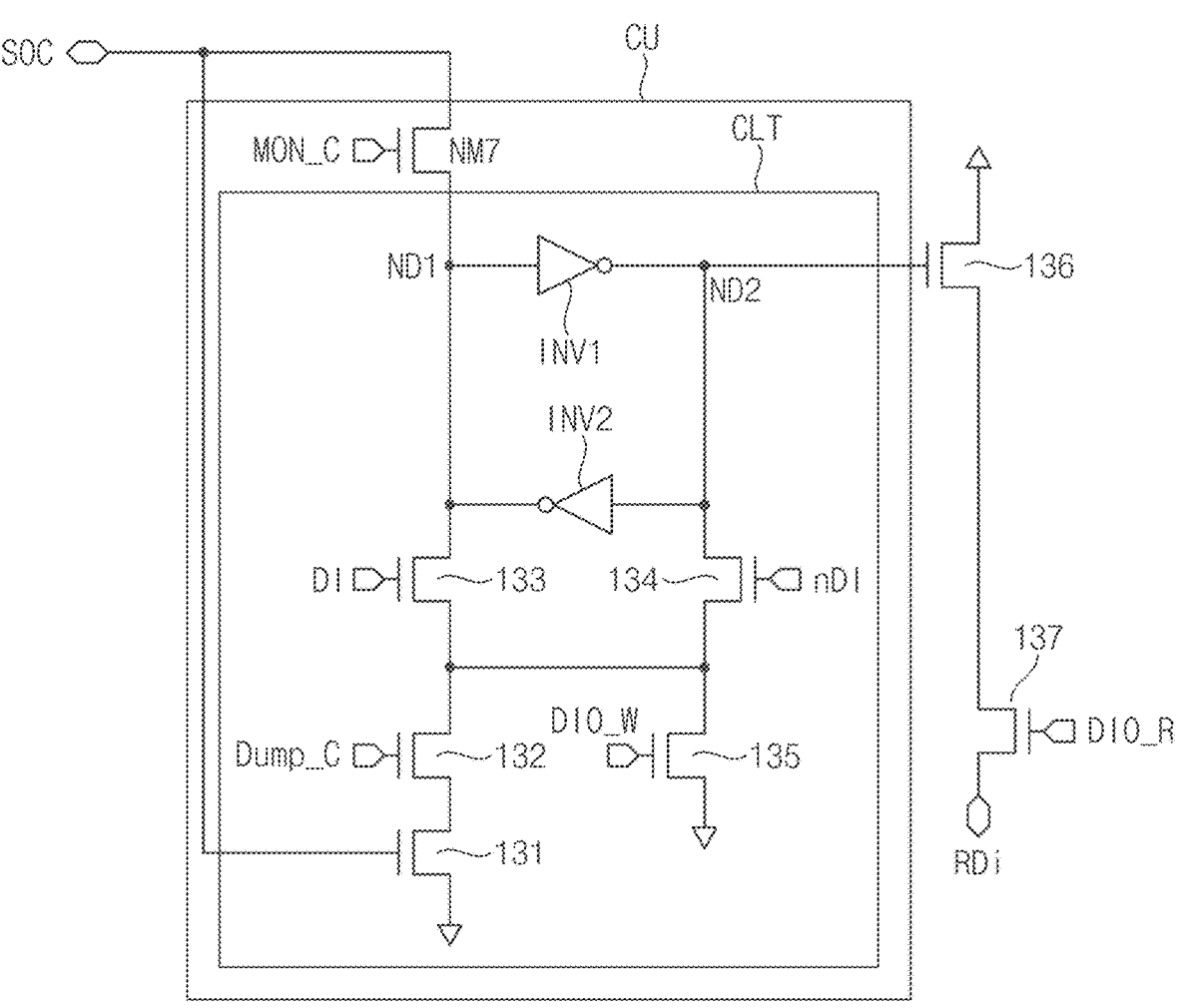
FIG. 17 is a circuit diagram illustrating an example of the cache unit according to some example embodiments.

FIG. 17 is a circuit diagram illustrating an example of the cache unit according to some example embodiments.

Referring to FIGS. 16 and 17, the cache unit CU may include the monitor transistor NM7 and the C-LATCH CLT, and the C-LATCH CLT may include first and second inverters INV21 and INV22, a dump transistor 132, and transistors 131, 133 to 135. The monitor transistor NM7 may be driven based on the cache monitoring signal MON_C, and may control a connection between the coupling sensing node SOC and the C-LATCH CLT.

The first inverter INV21 may be connected between the first node ND1 and the second node ND2, the second inverter INV22 may be connected between the second node ND2 and the first node ND1, and thus, the first and second inverters INV21 and INV22 may form a latch. The transistor 131 may include a gate connected to the combined sensing node SOC. The dump transistor 132 may be driven by a dump signal Dump_C, and may transmit data stored in the C-LATCH CL to a main latch, for example, the S-LATCH SL in the page buffer unit PBU. The transistor 133 may be driven by a data signal DI, a transistor 134 may be driven by a data inversion signal nDI, and the transistor 135 may be driven by a write control signal DIO_W. When the write control signal DIO_W is activated, voltage levels of the first and second nodes ND1 and ND2 may be determined based on the data signal DI and the data inversion signal nDI, respectively.

The cache unit CU may be connected to an data I/O line (or data I/O terminal) RDi via transistors 136 and 137. The transistor 136 may include a gate connected to the second node ND2, and may be turned on or off based on a voltage level of the second node ND2. The transistor 137 may be driven by a read control signal DIO_R. When the read control signal DIO_R is activated and the transistor 137 is turned on, a voltage level of the input/output terminal RDi may be determined as '1' or '0' based on a state of the C-LATCH CLT.

Figure 18:
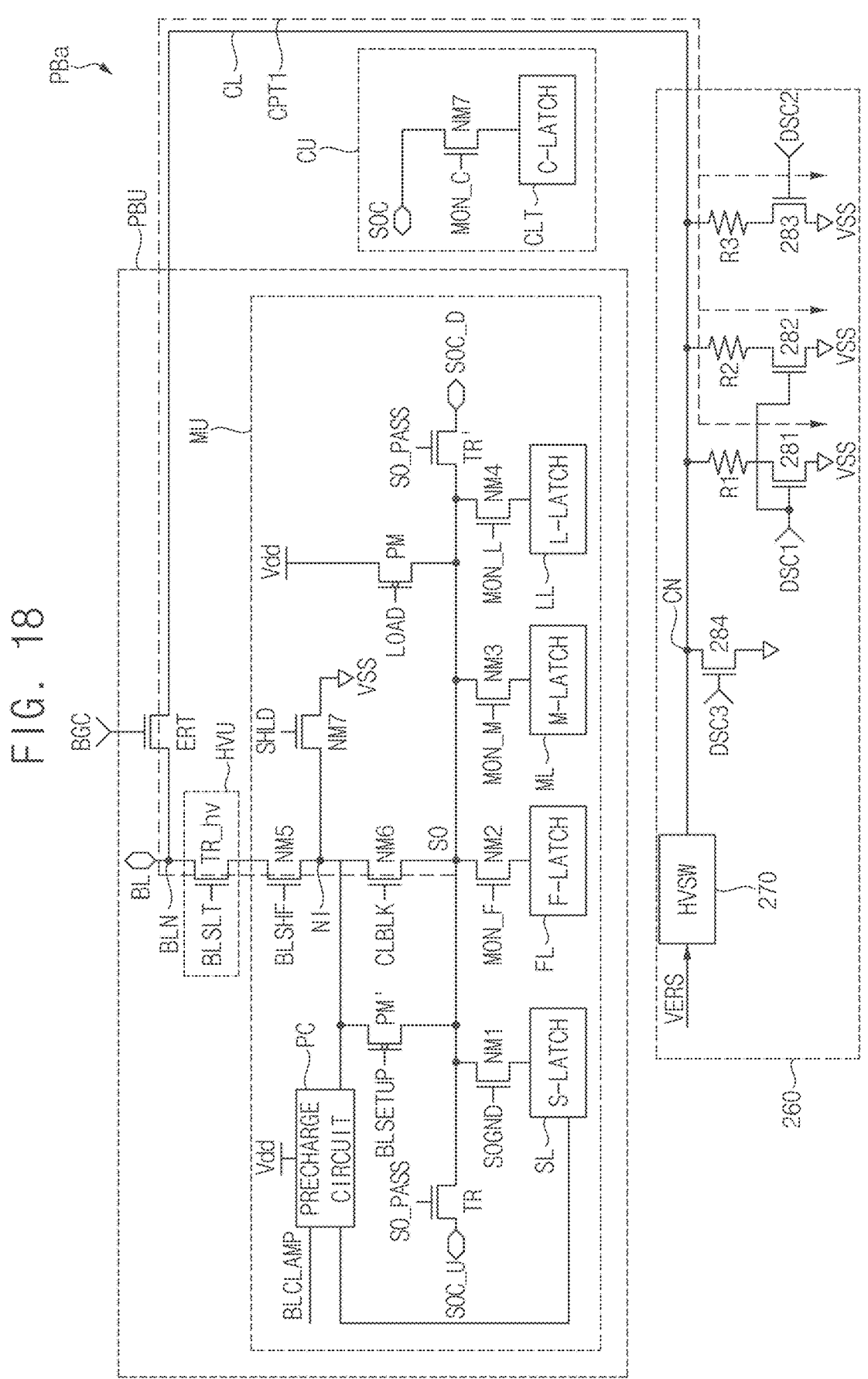
FIGS. 18 and 19 illustrate examples in which the control circuit adjusts at least one discharging path in the driver in FIG. 16, respectively.
Figure 19:
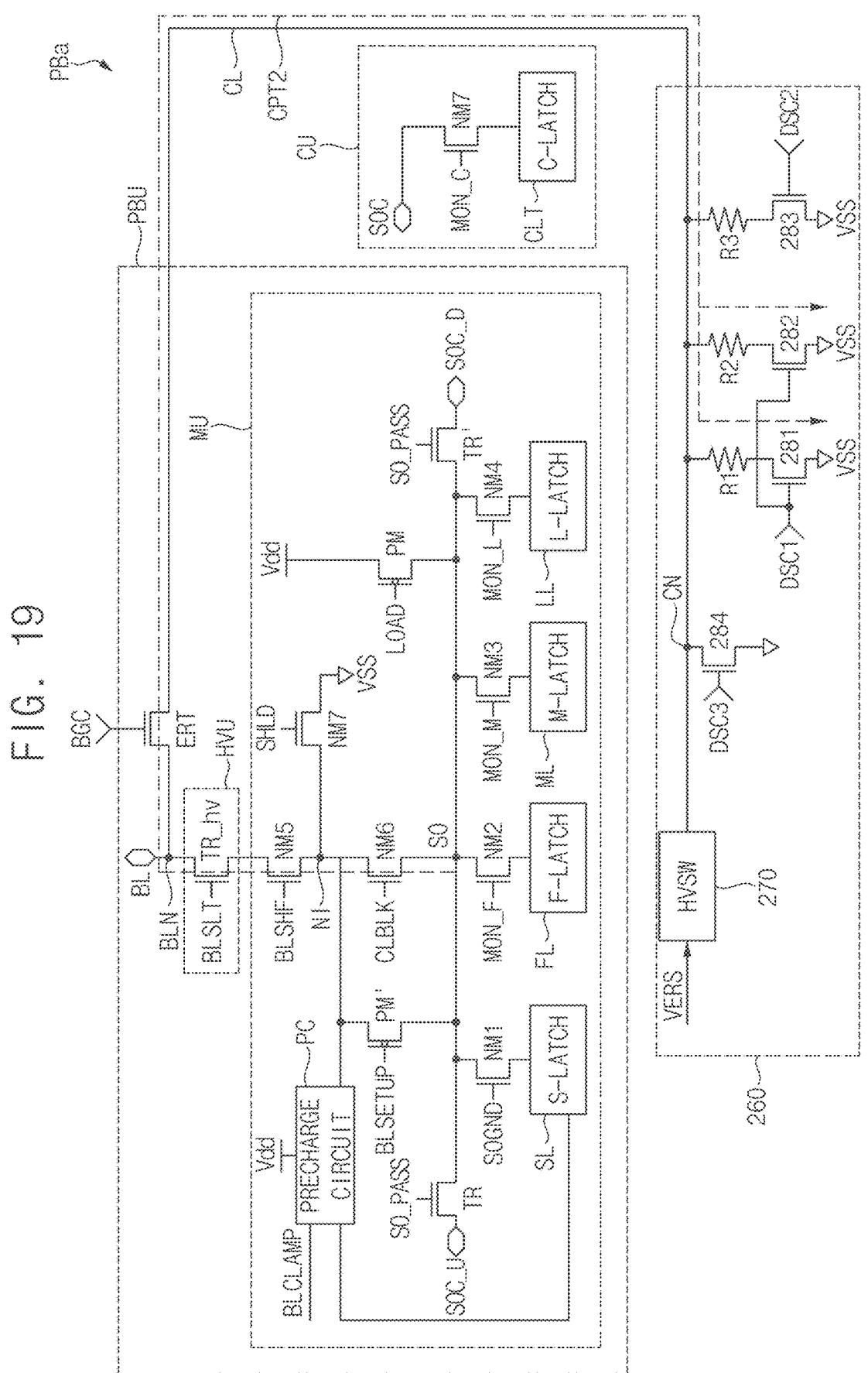

FIGS. 18 and 19 illustrate examples in which the control circuit adjusts at least one discharging path in the driver in FIG. 16, respectively.

Referring to FIG. 18, when the control circuit 220 activates the discharge control signals DSC1 and DSC2 to turn on the discharge transistors 281, 282 and 283 from among the plurality of discharge transistors 281, 282, 283 and 284 during the first time interval, a voltage level of the sensing node SO may decrease through a discharging path CPT1.

Referring to FIG. 19, when the control circuit 220 activates the discharge control signal DSC1 to turn on the discharge transistors 281 and 282 from among the plurality of discharge transistors 281, 282, 283 and 284 during the first time interval, a voltage level of the sensing node SO may decrease through a discharging path CPT2.

A decreasing speed of the voltage level of the sensing node SO in FIG. 18 may be faster than a decreasing speed of the voltage level of the sensing node SO in FIG. 19.

Figure 20:
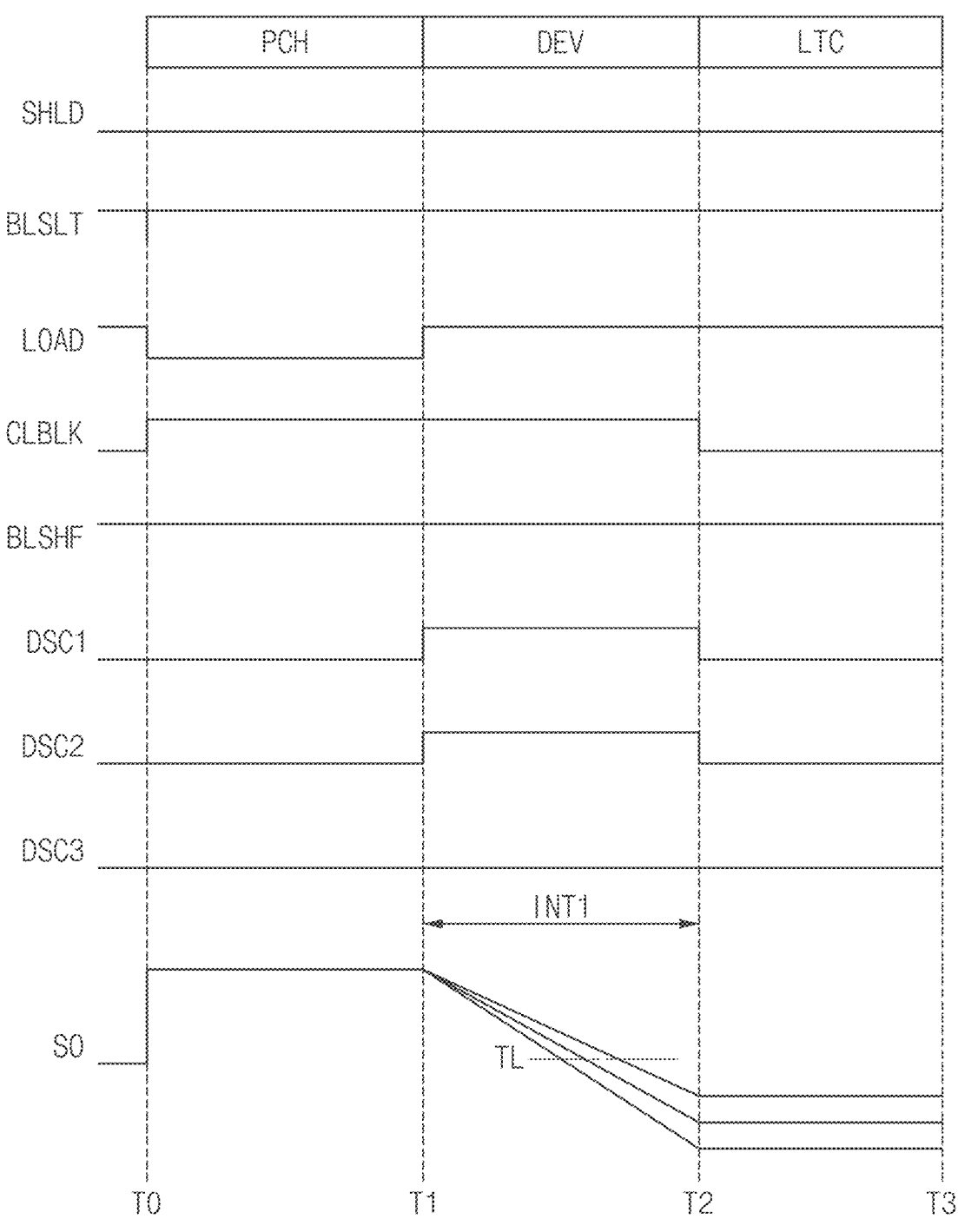
FIG. 20 is a timing diagram illustrating operation of the page buffer and the driver in FIG. 16 when the first test is performed.

FIG. 20 is a timing diagram illustrating operation of the page buffer and the driver in FIG. 16 when the first test is performed.

In FIG. 20, a precharge period PCH from a time point TO and to a time point T1, a develop period DEV from the time point T1 and to a time point T2, and a latch period LTC from the time point T2 and to a time point T3 are illustrated.

FIG. 20 may correspond to an operation of providing at least one discharging path in FIG. 3A and performing sensing and latching operation in FIG. 3B.

Referring to FIGS. 16 and 20, a precharge operation is performed during the precharge period PCH. The sensing node SO is charged for the precharge operation. When the shield signal SHLD is deactivated and each of the bit-line connection control signal CLBLK, the load signal LOAD, the bit-line shut-off signal BLSHF and the connection control signal BGC is activated, the sensing node SO is precharged to a voltage level of the power supply voltage.

When the load signal LOAD is activated with a high level at the time point T1, a current supply from the power supply voltage Vdd to the sensing node SO is interrupted. When the discharge control signals DSC1 and DSC2 are activated and the discharge control signal DSC3 is deactivated during a first time interval INT1 between the time points T1 and T2, a discharging path is provided through the sensing node SO, the bit-line node BLN, the connection node CN and the discharge transistors 281, 282 and 283, and a voltage level of the sensing node SO drops (decreases) until the time point T2.

When the bit-line connection control signal CLBLK, the connection control signal BGC and the discharge control signals DSC1 and DSC2 are deactivated with a low level from the time point T2 and the time point T3, the discharging path is blocked and a latch operation to latch a voltage level of the sensing node SO may be performed.

When a number of discharge transistors that are turned on during the first time interval from among the plurality of discharge transistors 281, 282, 283 and 284 is varied during the first time interval INT1, a decreasing slope of the voltage level of the sensing node SO (i.e., a time interval of the sensing node SO arriving at a trip level) may be adjusted.

FIG. 21 illustrates a page buffer and at least one driver in the nonvolatile memory device of FIG. 8 according to some example embodiments.

In FIG. 21, a page buffer PB1, a page buffer PB2, a first driver 260a and a second driver 260b are illustrated.

For convenience of explanation, a portion of a page buffer unit PBU1 of the page buffer PB1 and a portion of a page buffer unit PBU2 of the page buffer PB2 are illustrated.

The page buffer unit PBU1 may include a connection transistor ERT1 and a bit-line selection transistor TR_hv1 that is connected to a bit-line node BLN1 to which the bit-line BL1 is to be connected. The bit-line selection transistor TR_hv1 may be driven by a bit-line selection signal BLSLT. The bit-line selection transistor TR_hv may include a high voltage transistor. The connection transistor ERT1 may be turned on by a connection control signal BGC1 and may selectively couple the bit-line node BLN1 to the first driver 260a through a first conduction line CL1.

The page buffer unit PBU1 may further include a precharge circuit PC1 capable of controlling a precharge operation on the bit-line BL1 or a first sensing node SO1 based on a bit-line clamping control signal BLCLAMP, and may further include a transistor PM1' driven by a bit-line setup signal BLSETUP. The precharge circuit PC1 may be connected to a power supply voltage Vdd.

In addition, the page buffer unit PBU1 may further include transistors NM15 and NM16 connected to each other in series between the bit-line selection transistor TV_hv1 and the first sensing node SO1. The transistor NM15 has a gate to receive a bit-line shut-off signal BLSHF and may be driven by the bit-line shut-off signal BLSHF. The transistor NM16 has a gate to receive a bit-line connection control signal CLBLK and may be driven by the bit-line connection control signal CLBLK. The transistor NM5 and the transistor NM6 may be connected to each other at an internal node NIL In addition, the page buffer unit PBU1 may further include a transistor NM17 that is connected between the internal node NI1 and the ground voltage VSS. The transistor NM17 has a gate to receive a shield signal SHLD, may be driven by the shield signal SHLD and may selectively discharge the internal node NI1. In addition, the page buffer unit PBU1 may further include a precharge transistor PM1. The precharge transistor PM1 may be connected to the first sensing node SO1, has a gate to receive a load signal LOAD, is driven by the load signal LOAD, and precharge the first sensing node SO1 to a precharge level in a first precharge period.

The first driver 260a may include a high voltage switch HVSW 270a, a plurality of first discharge transistors 281a, 282a, 283a and 284a and a plurality of resistors R11, R12 and R13.

The high voltage switch HVSW 270a may provide the erase voltage VERS to the first bit-line node BLN1 through the first conduction line CL1.

The plurality of first discharge transistors 281a, 282a, 283a and 284a may be connected in parallel between a first connection node CN1 coupled to the first conduction line CL1 and the ground voltage VSS.

The discharge transistor 281a may be connected between the first connection node CN1 and the ground voltage VSS through the resistor R11, the discharge transistor 282a may be connected between the first connection node CN1 and the ground voltage VSS through the resistor R12, the discharge transistor 283a may be connected between the first connection node CN1 and the ground voltage VSS through the resistor R13 and the discharge transistor 284a may be directly connected between the first connection node CN1 and the ground voltage VSS.

A discharge control signal DSC11 may be applied to each gate of the discharge transistors 281a and 282a, a discharge control signal DSC12 may be applied to a gate of the discharge transistor 283a and a discharge control signal DSC13 may be applied to a gate of the discharge transistor 284a.

The discharge control signals DSC11, DSC12 and DSC13 may be included in the discharge control signal DSC in FIG. 8.

The page buffer unit PBU2 may include a connection transistor ERT2 and a bit-line selection transistor TR_hv2 that is connected to a bit-line node BLN2 to which the bit-line BL2 is to be connected. The bit-line selection transistor TR_hv2 may be driven by the bit-line selection signal BLSLT. The bit-line selection transistor TR_hv may include a high voltage transistor. The connection transistor ERT2 may be turned on by a connection control signal BGC2 and may selectively couple the bit-line node BLN2 to the second driver 260b through a second conduction line CL1.

The page buffer unit PBU2 may further include a pre-charge circuit PC2 capable of controlling a precharge operation on the bit-line BL2 or a second sensing node SO2 based on the bit-line clamping control signal BLCLAMP, and may further include a transistor PM2' driven by the bit-line setup signal BLSETUP. The precharge circuit PC2 may be connected to the power supply voltage Vdd.

Alternatively or additionally, the page buffer unit PBU2 may further include transistors NM25 and NM26 connected to each other in series between the bit-line selection transistor TV_hv2 and the second sensing node SO2. The transistor NM25 has a gate to receive the bit-line shut-off signal BLSHF and may be driven by the bit-line shut-off signal BLSHF. The transistor NM26 has a gate to receive the bit-line connection control signal CLBLK and may be driven by the bit-line connection control signal CLBLK. The transistor NM25 and the transistor NM26 may be connected to each other at an internal node NI2. In addition, the page buffer unit PBU2 may further include a transistor NM27 that is connected between the internal node NI1 and the ground voltage VSS. The transistor NM27 has a gate to receive the shield signal SHLD, may be driven by the shield signal SHLD and may selectively discharge the internal node NI2. In addition, the page buffer unit PBU2 may further include a precharge transistor PM2. The precharge transistor PM2 may be connected to the second sensing node SO2, has a gate to receive the load signal LOAD, is driven by the load signal LOAD, and precharge the second sensing node SO2 to a precharge level in a second precharge period.

The second driver 260b may include a high voltage switch HVSW 270b, a plurality of second discharge transistors 281b, 282b, 283b and 284b and a plurality of resistors R21, R22 and R23.

The high voltage switch HVSW 270b may provide the erase voltage VERS to the second bit-line node BLN2 through the second conduction line CL2.

The plurality of second discharge transistors 281b, 282b, 283b and 284b may be connected in parallel between a second connection node CN2 coupled to the second conduction line CL2 and the ground voltage VSS.

The discharge transistor 281b may be connected between the second connection node CN2 and the ground voltage VSS through the resistor R21, the discharge transistor 282b may be connected between the second connection node CN2 and the ground voltage VSS through the resistor R22, the discharge transistor 283b may be connected between the second connection node CN2 and the ground voltage VSS through the resistor R23 and the discharge transistor 284b may be directly connected between the second connection node CN2 and the ground voltage VSS.

A discharge control signal DSC21 may be applied to each gate of the discharge transistors 281b and 282b, a discharge control signal DSC22 may be applied to a gate of the discharge transistor 283b and a discharge control signal DSC23 may be applied to a gate of the discharge transistor 284b.

The discharge control signals DSC21, DSC22 and DSC23 may be included in the discharge control signal DSC in FIG. 8.

In FIG. 21, the bit-line node BLN1 may represent each of odd bit-line nodes and the first driver 260a may be connected to the odd bit-line nodes. In this case, lengths of conduction lines between the first connection node CN1 and the odd bit-line nodes may vary depending on positions of odd page buffers in the peripheral circuit 200. In addition, the bit-line node BLN2 may represent each of even bit-line nodes and the second driver 260b may be connected to the odd bit-line nodes. In this case, lengths of conduction lines between the second connection node CN2 and the odd bit-line nodes may vary depending on positions of even page buffers in the peripheral circuit 200.

The method of testing the nonvolatile memory device according to some example embodiments, may test state of sensing nodes depending on loading of conduction lines which are determined based on positions of the page buffers.

Figure 22:
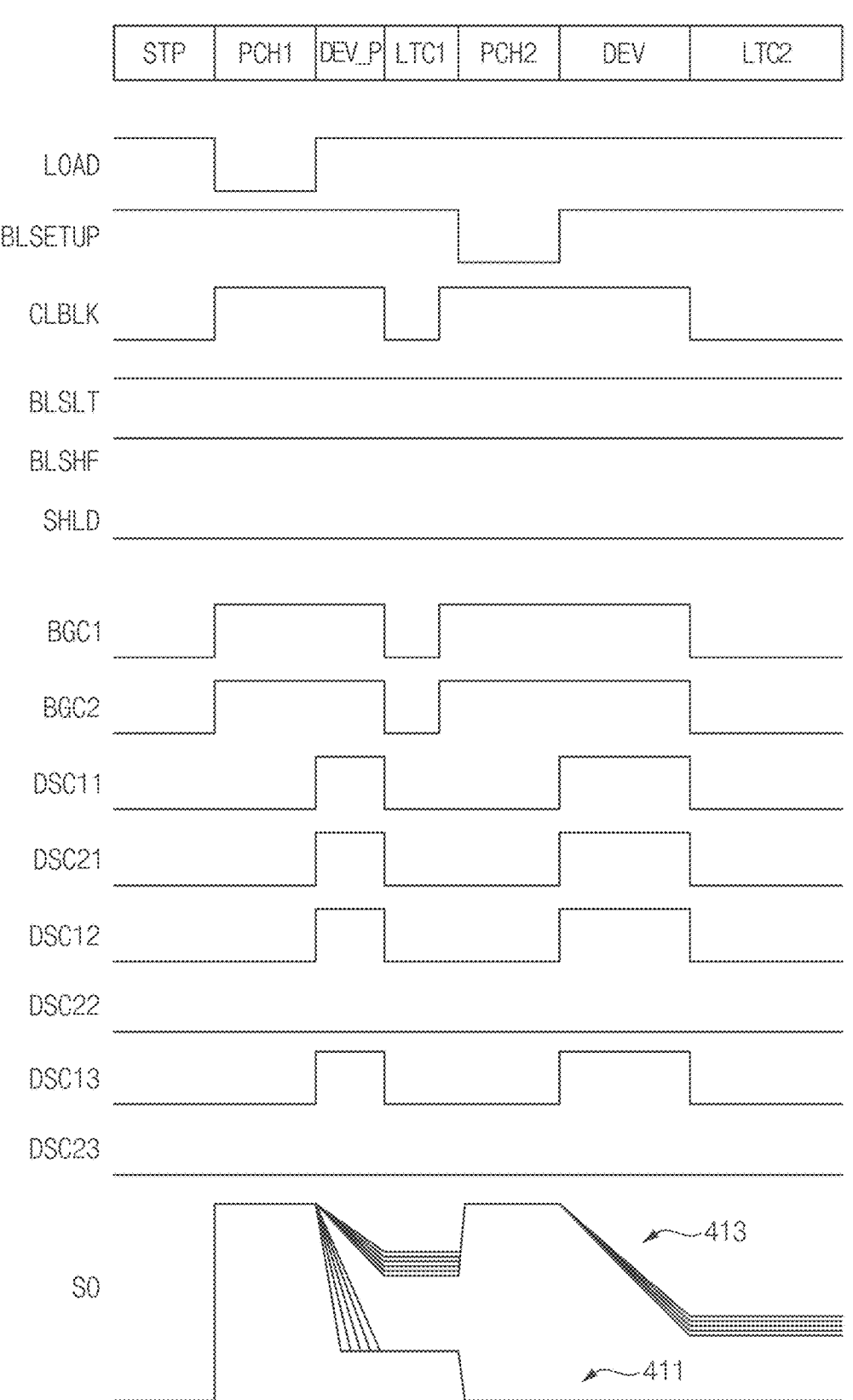
FIG. 22 is a timing diagram illustrating operation of the page buffers and the drivers in FIG. 21 when the first test is performed.

FIG. 22 is a timing diagram illustrating operation of the page buffers and the drivers in FIG. 21 when the first test is performed.

In FIG. 22, a setup period STP, a first precharge period PCH1, a pre-develop period DEV_P, a first latch period LTC1, a second precharge period PCH2, a develop period DEV and a second latch period LTC2 are illustrated.

During each of the setup period STP, the first precharge period PCH1, the pre-develop period DEV_P, the first latch period LTC1, the second precharge period PCH2, the develop period DEV and the second latch period LTC2, the bit-line selection signal BLSLT and the bit-line shut-off signal BLSHF are activated and the shield signal SHLD and the discharge control signals DCS22 and DCS23 are deactivated.

During the set-up period STP, the load signal LOAD and the bit-line setup signal BLSETUP are deactivated with a high level and bit-line connection control signal CLBLK, the connection control signals BGC1 and BGC2 and the discharge control signals DSC11, DSC21, DSC12 and DSC13 are deactivated with a low level. During the first precharge period PCH1, the load signal LOAD and the bit-line connection control signal CLBLK are activated and thus, the first sensing node SO1 and the second sensing node SO2 are precharged, the connection control signals BGC1 and BGC2 are activated with a high level, and the discharge control signals DSC11, DSC21, DSC12 and DSC13 are maintained at a low level. During the pre-develop period DEV_P, the load signal LOAD is deactivated, the bit-line connection control signal CLBLK is maintained at an activated state, the discharge control signals DSC11, DSC21, DSC12 and DSC13 are activated with a high level, and thus a discharging path is provided between the first sensing node SO1 and the first discharge transistors 281a, 282a, 283a and 284a and a discharging path is provided between the second sensing node SO2 and the second discharge transistors 281b and 282b. Therefore, a voltage level of the first sensing node SO1 drops faster than a voltage level of the first sensing node SO2.

During the first latch period LTC1, the bit-line connection control signal CLBLK, the connection control signals BGC1 and BGC2 and the discharge control signals DSC11, DSC21, DSC12 and DSC13 are deactivated and thus, the discharging path between the first sensing node SO1 and the first discharge transistors 281a, 282a, 283a and 284a is blocked, the discharging path between the second sensing node SO2 and the second discharge transistors 281b and 282b is blocked and the voltage level of each of the first sensing node SO1 and the second sensing node SO2 is latched.

During the second precharge period PCH2, the bit-line setup signal BLSETUP is activated, the bit-line connection control signal CLBLK is activated, the second sensing node SO2 is precharged depending on a logic level of data stored in a sensing latch (SL in FIG. 16) of the page buffer unit PUB2, the first sensing node SO2 is not precharged depending on a logic level of data stored in a sensing latch (SL in FIG. 16) of the page buffer unit PUB1, the connection control signals BGC1 and BGC2 are activated, and the discharge control signals DSC11, DSC21, DSC12 and DSC13 are maintained at deactivated state.

During the develop period DEV, the bit-line setup signal BLSETUP is deactivated, the bit-line connection control signal CLBLK is maintained at activated state, the connection control signals BGC1 and BGC2 are maintained at activated state, the discharge control signals DSC11, DSC21, DSC12 and DSC13 are activated, and thus a discharging path is provided between the second sensing node SO2 and the second discharge transistors 281b and 282b.

In FIG. 22, a reference numeral 411 denotes the voltage level of the first sensing node SO1 and a reference numeral 413 denotes the voltage level of the second sensing node SO2. Therefore, the control circuit 220 in FIG. 8 may adjust decreasing speed of the voltage level of the second sensing node SO2 by adjusting a number of discharge transistors that are turned on from among the second discharge transistors 281b, 282b, 283b and 284b with the on-state being mimicked during the develop period DEV.

Figure 23:
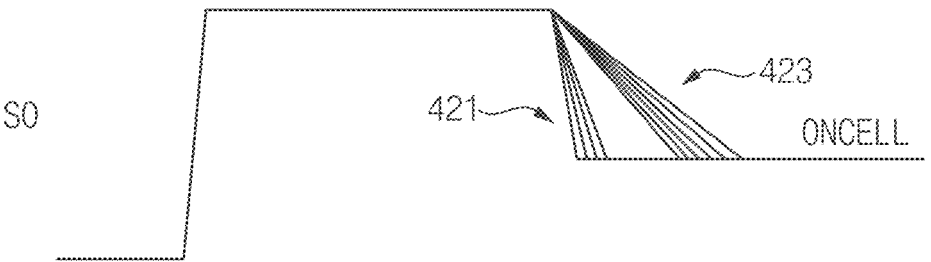
FIG. 23 is a timing diagram illustrating operation of the page buffers and the drivers in FIG. 21 when the first test is performed.

FIG. 23 is a timing diagram illustrating operation of the page buffers and the drivers in FIG. 21 when the first test is performed.

In FIG. 23, a reference numeral 421 denotes the voltage level of the first sensing node SO1 and a reference numeral 423 denotes the voltage level of the second sensing node SO2.

In FIG. 23, it is assumed that during the second precharge period PCH2 and during the develop period DEV in FIG. 22, the connection control signals BGC1 and BGC2 are activated and the discharge control signals DSC11, DSC21, DSC12 and DSC13 are activated. Accordingly, a discharging path is provided between the first sensing node SO1 and the first discharge transistors 281a, 282a, 283a and 284a and a discharging path is provided between the second sensing node SO2 and the second discharge transistors 281b and 282b. Therefore, the voltage level of the first sensing node SO1 drops faster than (has a steeper slope than) the voltage level of the first sensing node SO2.

Figure 24:
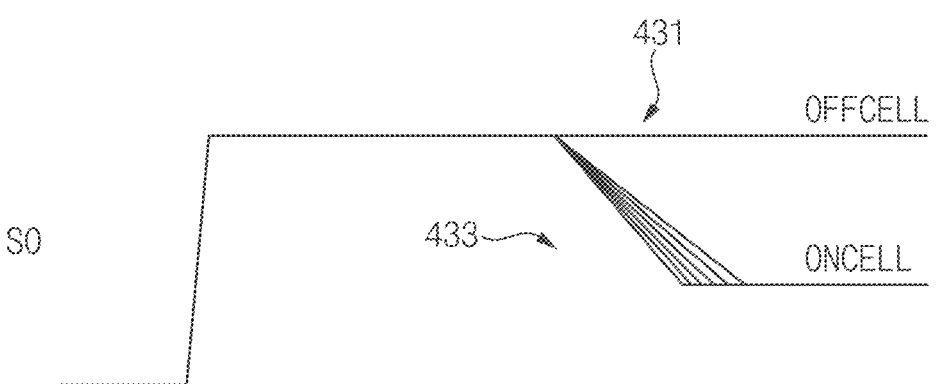
FIG. 24 is a timing diagram illustrating operation of the page buffers and the drivers in FIG. 21 when the first test is performed.

FIG. 24 is a timing diagram illustrating operation of the page buffers and the drivers in FIG. 21 when the first test is performed.

In FIG. 24, a reference numeral 431 denotes the voltage level of the first sensing node SO1 and a reference numeral 433 denotes the voltage level of the second sensing node SO2.

In FIG. 24, it is assumed that during the second precharge period PCH2 and during the develop period DEV in FIG. 22, the connection control signals BGC1 and BGC2 are activated, the first discharge control signals DSC11, DSC12 and DSC13 applied to the first driver 260a are deactivated to mimic an off-state of memory cells and a portion of the first discharge control signals DSC21, DSC22 and DSC23 applied to the second driver 260b are activated. Therefore, the control circuit 220 may adjust a time interval of the second sensing node SO2 arriving at a trip level by varying a number of discharge transistors that are turned on from among the second discharge transistors 281b, 282b, 283b and 284b.

FIG. 25 is a plan view illustrating a top surface of the second semiconductor layer in the nonvolatile memory device of FIG. 10 according to some example embodiments. FIG. 26 is a plan view illustrating a top surface of the first semiconductor layer, overlapping the plan view of the FIG. 25.

Referring to FIGS. 25 and 26, first and second address decoders 241 and 243 may extend in a direction perpendicular to a direction in which the word-lines WL extend. In addition, the first and second page buffer circuits 211 and 213 may extend in a direction perpendicular to a direction in which the bit-lines BL extend.

Referring to FIG. 25, the second semiconductor layer L2 may be divided into first through fourth regions R1 through R4 by a first virtual line X0-X0' in the second horizontal direction HD2 parallel to the word-lines WL and a second virtual line Y0-Y0' in the first horizontal direction HD1 parallel to the bit-lines BL.

For example, the first virtual line X0-X0' and the second virtual line Y0-Y0' may overlap the memory cell array 100 located on the first semiconductor layer L1 in the vertical direction VD. For example, at least a part of each of the first through fourth regions R1 through R4 may overlap the memory cell array 100 located on the first semiconductor layer L1 in the vertical direction VD. The first and second address decoders 241 and 243 may be respectively located in the second and third regions R2 and R3, and the first and second page buffer circuits 211 and 213 may be respectively located in the first and fourth regions R1 and R4.

Referring to FIG. 26, a memory cell array 100a may be located on the first semiconductor layer L1, and the memory cell array 100a may include a first vertical structure VS1 and a second vertical structure VS2. As shown in FIG. 26, the memory cell array 100a may include a plurality of memory blocks BLKa-BLKr formed as the first and second vertical structures VS1 and VS2. The memory blocks BLKi-BLKr may be arranged in the second horizontal direction HD2. Each of the memory blocks BLKa-BLKr may include a first sub-block and a second sub-block. The memory block BLKa includes a first sub-block SBa1 and a second sub-block SBa2. The memory block BLKi includes a first sub-block SBi1 and a second sub-block SBi2. The memory block BLKr includes a first sub-block SBr1 and a second sub-block SBr2.

As shown in FIG. 26, the first vertical structure VS1 may include a plurality of first sub-blocks of the memory blocks BLKa-BLKr and a plurality of first via areas EVA11, VA11, VA12 and EVA12 which are spaced apart in the second horizontal direction HD2. In addition, the second vertical structure VS2 may include a plurality of second sub-blocks of the memory blocks BLKa-BLKr and a plurality of second via areas EVA21, VA21, VA22 and EVA22 which are spaced apart in the second horizontal direction HD2. The first sub-blocks may be arranged among the first via areas EVA11, VA11, VA12 and EVA12 and the second sub-blocks may be arranged among the second via areas EVA21, VA21, VA22 and EVA22.

For example, in the first via areas VA11 and VA12, one or more first through-hole vias that each pass through the first vertical structure VS1 and are connected to the first page buffer circuit 211 may be formed. In addition, in the second via areas VA21 and VA22, one or more second through-hole vias that each pass through the second vertical structure VS2 and are connected to the second page buffer circuit 213 may be formed. For example, in the first and second edge via areas EVA11 and EVA12, one or more edge through-hole vias that each pass through the first vertical structure VS1 and are connected to the second address decoder 243 may be formed. In addition, in the third and fourth edge via areas EVA21 and EVA22, one or more edge through-hole vias that each pass through the second vertical structure VS22 and are connected to the first address decoder 241 may be formed.

Figure 27:
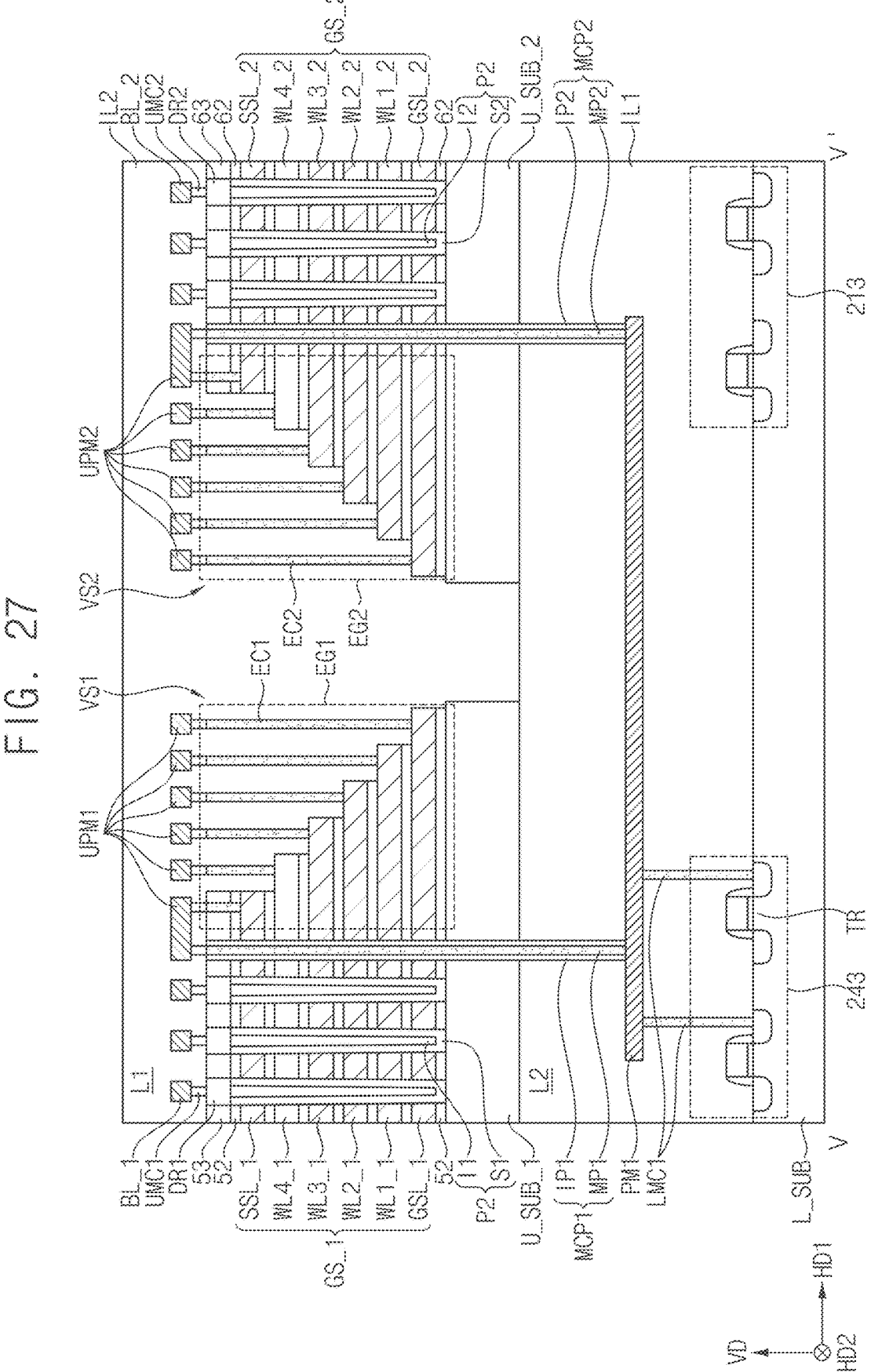
FIG. 27 is a cross-sectional view of the nonvolatile memory device according to some example embodiments.

FIG. 27 is a cross-sectional view of the nonvolatile memory device according to some example embodiments. For example, FIG. 27 is a cross-sectional view taken along line V-V' of FIG. 26, illustrating configurations of the first and second semiconductor layers.

Referring to FIG. 27, the second semiconductor layer L2 may include a lower substrate L_SUB, and the second address decoder 243 and the second page buffer circuit 213 formed on the lower substrate L_SUB. In addition, the second semiconductor layer L2 may include a plurality of first lower contacts LMC1 electrically connected to the second address decoder 243, a first lower conductive line PM1 electrically connected to the plurality of first lower contacts LMC1, and a lower insulating layer IL1 covering the plurality of first lower contacts LMC1 and the first lower conductive line PM1.

The second address decoder 243 and the second page buffer circuit 213 may be formed on portions of the lower substrate L_SUB. In other words, the second address decoder 243 and/or the second page buffer circuit 213 may be formed by forming a plurality of transistors TR on the lower substrate L_SUB.

The first semiconductor layer L1 may include a first upper substrate U_SUB_1, a second upper substrate U_SUB_2, the first vertical structure VS1 located on the first upper substrate U_SUB_1, and the second vertical structure VS2 located on the second upper substrate U_SUB_2. In addition, the first semiconductor layer L1 may include a plurality of first upper contacts UMC1, a plurality of first bit-lines BL1, a plurality of first edge contacts EC1, and a plurality of first upper conductive lines UPM1 which are electrically connected to the first vertical structure VS1. In addition, the first semiconductor layer L1 may include a plurality of second upper contacts UMC2, a plurality of second bit-lines BL2, a plurality of second edge contacts EC2, and a plurality of second upper conductive lines UPM2 which are electrically connected to the second vertical structure VS2. In addition, the first semiconductor layer L1 may include an upper insulating and passivation layer IL2 covering the first and second vertical structures VS1 and VS2 and various conductive lines.

The first and second upper substrates U_SUB_1 and U_SUB_2 may be support layers that respectively support first and second gate conductive layers GS_1 and GS_2. The first and second upper substrates U_SUB_1 and U_SUB_2 may be, for example, base substrates.

The first vertical structure VS1 may include the first gate conductive layers GS_1 located on the first upper substrate U_SUB_1, and a plurality of pillars P1 that pass through the first gate conductive layers GS_1 and extend in the third direction on a top surface of the first upper substrate U_SUB_1. The first gate conductive layers GS_1 may include a ground selection line GSL_1, word-lines WL1_1 through WL4_1, and a string selection line SSL_1. The ground selection line GSL_1, the word-lines WL1_1 through WL4_1, and the string selection line SSL_1 may be sequentially formed on the first upper substrate U_SUB_1, and an insulating layer 52 may be located under or over each of the first gate conductive layers GS_1. Since the first and second vertical structures VS1 and VS2 have corresponding configurations in the cross-sectional view taken along line V-V', a repeated explanation of elements of the second vertical structure VS2 corresponding to those of the first vertical structure VS1 may not be given.

The second vertical structure VS2 may include a plurality of pillars P2 that pass through the second gate conductive layers GS_2. Each of the pillars P2 may include a surface layer S2 and an inside Il. The second gate conductive layers GS_2 may include a ground selection line GSL_2, word lines WL1_2 through WL4_2, and a string selection line SSL_2. An insulating layer 62 may be located under or over each of the second gate conductive layers GS_2.

Each of the plurality of pillars P1 may include a surface layer S1 and an inside Il. For example, the surface layer S1 of each of the pillars P1 may include a silicon material doped with an impurity, or a silicon material not doped with an impurity.

For example, the ground selection line GSL_1 and a portion of the surface layer S1 adjacent to the ground selection line GSL_1 may constitute the ground selection transistor GST (see FIG. 12). In addition, the word-lines WL1_1 through WL4_1 and a portion of the surface layer S1 adjacent to the word-lines WL1_1 through WL4_1 may constitute the memory cell transistors MC1~MC8 (see FIG. 12). In addition, the string selection line SSL_1 and a portion of the surface layer S1 adjacent to the string selection line SSL_1 may constitute the string selection transistor SST (see FIG. 12).

A drain region DR1 may be formed on the pillar P1. A drain region DR2 may be formed on the pillar P2. For example, the drain region DR1 may include a silicon material doped with an impurity. An etch-stop film 53 may be formed on a side wall of the drain region DR1. An etch-stop film 63 may be formed on a side wall of the drain region DR2.

The first vertical structure VS1 may include an edge region EG1. The second vertical structure VS2 may include an edge region EG2. As shown in FIG. 27, a cross-section of the edge region EG1 may form a stepped pad structure. The stepped pad structure may be referred to as a "word line pad". The plurality of first edge contacts EC1 may be connected to the edge region EG1, and an electrical signal may be applied from a peripheral circuit such as the second row decoder 243 through the first edge contacts EC1. For example, a contact plug MCP1 that passes through the first vertical structure VS_1, the first upper substrate U_SUB_1, and a part of the second semiconductor layer L2 may have one side connected to the first lower conductive line PM1 and the other side electrically connected to the edge region EG1 through the first upper conductive lines UPM1.

At least some of the first edge contacts EC1 may pass through parts of the first and second semiconductor layers L1 and L2 in the third direction between the first and second upper substrates U_SUB_1 and U_SUB_2 and may have one side electrically connected to a contact plug connected to the lower conductive line (e.g., PM1).

Figure 28:
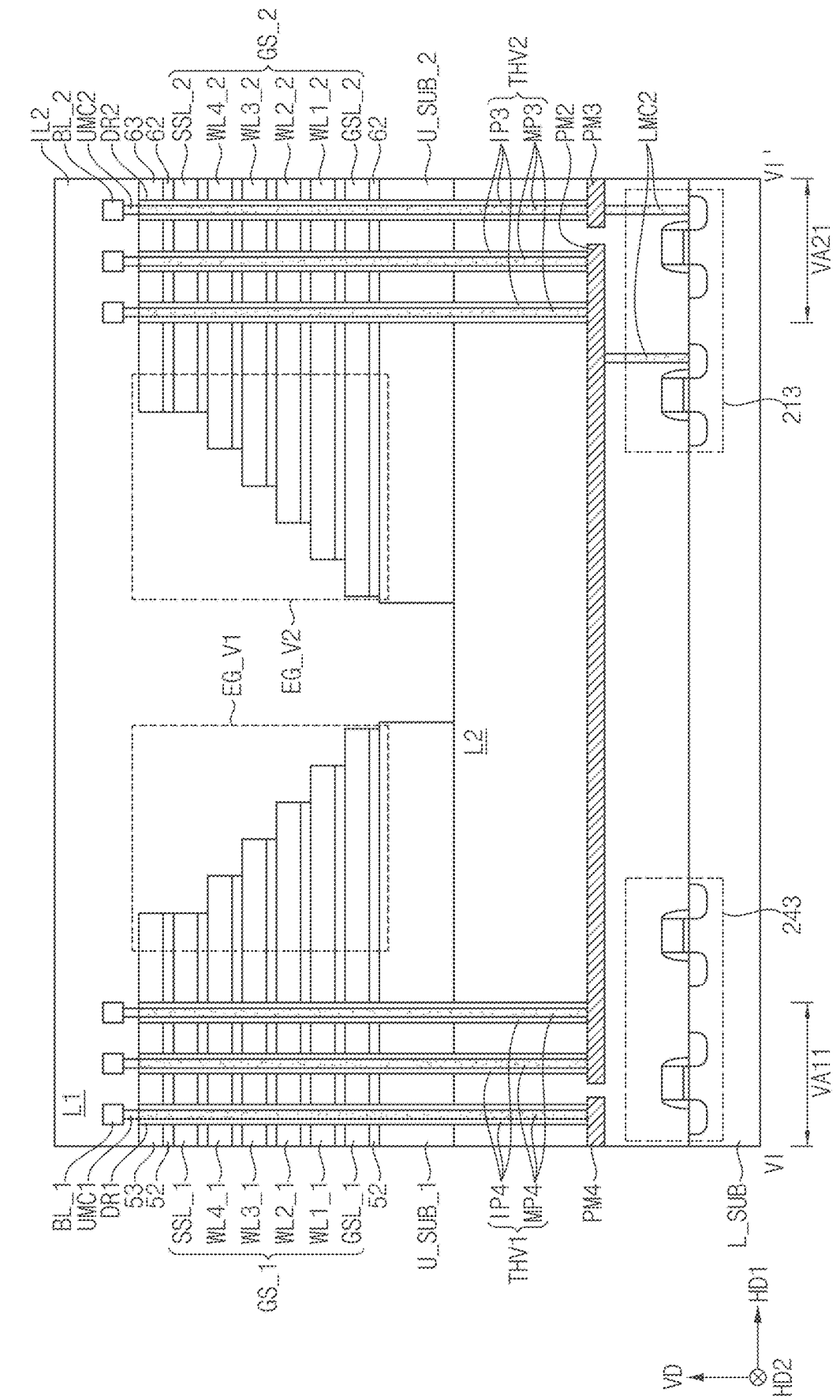
FIG. 28 is a cross-sectional view taken along line VI-VI' of FIG. 26, illustrating configurations of the first and second semiconductor layers.

FIG. 28 is a cross-sectional view taken along line VI-VI' of FIG. 26, illustrating configurations of the first and second semiconductor layers. For example, FIG. 28 may be a cross-sectional view illustrating the second semiconductor layer L2 overlapping the first partial block SB_1 and the via areas VA11 and VA21 provided in the first semiconductor layer L1. A repeated explanation of the same elements in FIG. 27 will not be given in FIG. 28.

Referring to FIG. 28, a plurality of through-hole vias THV1 passing through the first vertical structure VS1, the first upper substrate U_SUB_1, and a part of the second semiconductor layer L2 may be formed in the first via region VAIL Each of the through-hole vias THV1 may include an insulating film pattern IP4 and a conductive pattern MP4. A plurality of through-hole vias THV2 passing through the second vertical structure VS2, the second upper substrate U_SUB_2, and a part of the second semiconductor layer L2 may be formed in the second via region VA21. Each of the through-hole vias THV2 may include an insulating film pattern IP3 and a conductive pattern MP3.

As shown in FIG. 28, each of the through-hole vias THV2 may electrically connect the second page buffer circuit 213 and the second upper contact UMC2 and each of the through-hole vias THV2 may electrically connect the second page buffer circuit 213 and the first upper contact UMC1. The first upper contact UMC1 may be connected to the first bit-line BL1 The second upper contact UMC2 may be connected to the second bit-line BL2. In other words, the first bit-lines BL1 may be electrically connected to the second page buffer circuit 213 formed on the second semiconductor layer L2 through the plurality of through-hole vias THV1 formed in the first via area VA11 and the second bit-lines BL2 may be electrically connected to the second page buffer circuit 213 formed on the second semiconductor layer L2 through the plurality of through-hole vias THV2 formed in the second via area VA21. In example embodiments, conductive patterns such as contacts may not be formed in the edge region EG_V1 of the first via area VA11 and in the edge region EG_V2 of the second via area VA21.

Figure 29:
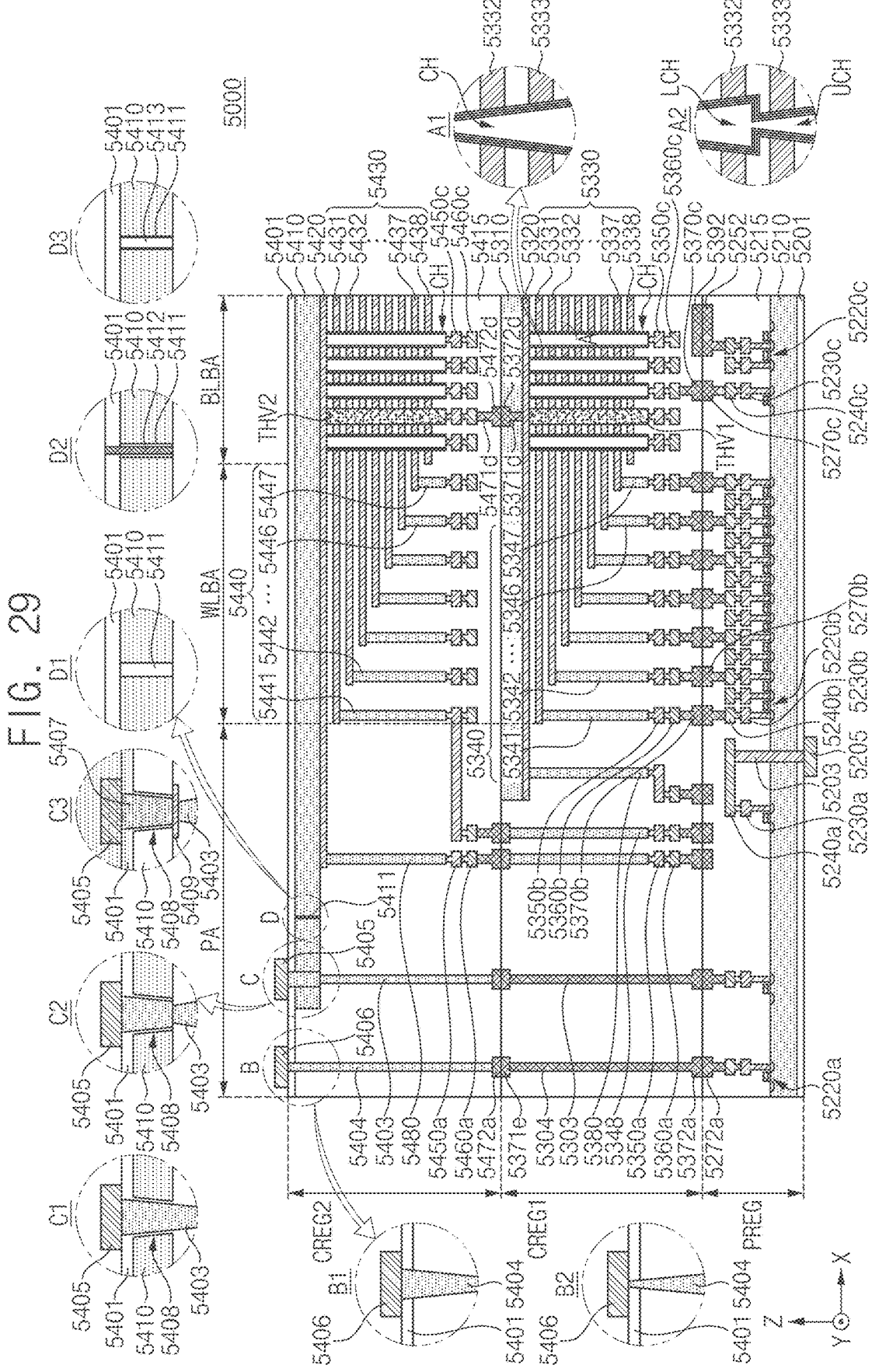
FIG. 29 is a cross-sectional view of a nonvolatile memory device according to some example embodiments.

FIG. 29 is a cross-sectional view of a nonvolatile memory device according to some example embodiments.

Referring to FIG. 29, a nonvolatile memory device (or a memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 29, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 29. However, example embodiments are not limited thereto. In certain example embodiments, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220*a*, 5220*b* and 5220*c* formed on the first substrate 5210. An interlayer insulating layer 5215 including one or more insulating layers may be provided on the plurality of circuit elements 5220*a*, 5220*b* and 5220*c*, and a plurality of metal lines electrically connected to the plurality of circuit elements 5220*a*, 5220*b* and 5220*c* may be provided in the interlayer insulating layer 5215. For example, the plurality of metal lines may include first metal lines 5230*a*, 5230*b* and 5230*c* connected to the plurality of circuit elements 5220*a*, 5220*b* and 5220*c*, and second metal lines 5240*a*, 5240*b* and 5240*c* formed on the first metal lines 5230*a*, 5230*b* and 5230*c*. The plurality of metal lines may be formed of at least one of various conductive materials. For example, the first metal lines 5230*a*, 5230*b* and 5230*c* may be formed of tungsten having a relatively high electrical resistivity, and the second metal lines 5240*a*, 5240*b* and 5240*c* may be formed of copper having a relatively low electrical resistivity.

The first metal lines 5230*a*, 5230*b* and 5230*c* and the second metal lines 5240*a*, 5240*b* and 5240*c* are illustrated and described in the present embodiments. However, example embodiments are not limited thereto. In certain example embodiments, at least one or more additional metal lines may further be formed on the second metal lines 5240*a*, 5240*b* and 5240*c*. In this case, the second metal lines 5240*a*, 5240*b* and 5240*c* may be formed of aluminum, and at least some of the additional metal lines formed on the second metal lines 5240*a*, 5240*b* and 5240*c* may be formed of copper having an electrical resistivity lower than that of aluminum of the second metal lines 5240*a*, 5240*b* and 5240*c*.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (5331 to 5338) may be stacked on the second substrate 5310 in a direction (i.e., the Z-axis direction) perpendicular to a top surface of the second substrate 5310. String selection lines and a ground selection line may be disposed on and under the word-lines 5330, and the plurality of word-lines 5330 may be disposed between the string selection lines and the ground selection line. Likewise, the second cell region CREG2 may include a third substrate 5410 and a common source line 5420, and a plurality of word-lines 5430 (5431 to 5438) may be stacked on the third substrate 5410 in a direction (i.e., the Z-axis direction) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some example embodiments, as illustrated in a region 'A1', the channel structure CH may be provided in the bit-line bonding region BLBA and may extend in the direction perpendicular to the top surface of the second substrate 5310 to penetrate the word-lines 5330, the string selection lines, and the ground selection line. The channel structure CH may include a data storage layer, a channel layer, and a filling insulation layer. The channel layer may be electrically connected to a first metal line 5350*c* and a second metal line 5360*c* in the bit-line bonding region BLBA. For example, the second metal line 5360*c* may be a bit-line and may be connected to the channel structure CH through the first metal line 5350*c*. The bit-line 5360*c* may extend in a first direction (e.g., a Y-axis direction) parallel to the top surface of the second substrate 5310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower word-lines 5331 and 5332. The lower channel LCH may include a data storage layer, a channel layer, and a filling insulation layer and may be connected to the upper channel UCH. The upper channel UCH may penetrate upper word-lines 5333 to 5338. The upper channel UCH may include a data storage layer, a channel layer, and a filling insulation layer, and the channel layer of the upper channel UCH may be electrically connected to the first metal line 5350*c* and the second metal line 5360*c*. As a length of a channel increases, due to characteristics of manufacturing processes, it may be difficult to form a channel having a substantially uniform width. The memory device 5000 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it is possible to reduce an influence of a non-uniform channel width between the lower and upper channels LCH and UCH on an operation of the memory device.

Meanwhile, the number of the lower word-lines 5331 and 5332 penetrated by the lower channel LCH is less than the number of the upper word-lines 5333 to 5338 penetrated by the upper channel UCH in the region 'A2'. However, example embodiments are not limited thereto. In certain example embodiments, the number of the lower word-lines penetrated by the lower channel LCH may be equal to or more than the number of the upper word-lines penetrated by the upper channel UCH. In addition, structural features and connection relation of the channel structure CH disposed in the second cell region CREG2 may be substantially the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As illustrated in FIG. 29, the first through-electrode THV1 may penetrate the common source line 5320 and the plurality of word-lines 5330. In certain example embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected to the first metal line 5350*c* and the second metal line 5360*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected to each other by the bonding method.

In addition, in the bit-line bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360*c* may be electrically connected to a page buffer included in the peripheral circuit region PERI. For example, some of the circuit elements 5220*c* of the peripheral circuit region PREG may constitute the page buffer, and the bit-line 5360*c* may be electrically connected to the circuit elements 5220*c* constituting the page buffer through an upper bonding metal pattern 5370*c* of the first cell region CREG1 and an upper bonding metal pattern 5270*c* of the peripheral circuit region PERI.

Referring continuously to FIG. 29, in the word-line bonding region WLBA, the word-lines 5330 of the first cell region CREG1 may extend in a second direction (e.g., an X-axis direction) parallel to the top surface of the second substrate 5310 and may be connected to a plurality of cell contact plugs 5340 (5341 to 5347). First metal lines 5350*b* and second metal lines 5360*b* may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370*b* of the first cell region CREG1 and upper bonding metal patterns 5270*b* of the peripheral circuit region PERI.

The cell contact plugs 5340 may be electrically connected to a row decoder included in the peripheral circuit region PERI. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PERI. In some embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the word-lines 5430 of the second cell region CREG2 may extend in the second direction (e.g., the X-axis direction) parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350*a* and a second metal line 5360*a* may be sequentially stacked on the common source line contact plug 5380 of the first cell region CREG1, and a first metal line 5450*a* and a second metal line 5460*a* may be sequentially stacked on the common source line contact plug 5480 of the second cell region CREG2.

Input/output pads 5205, 5405 and 5406 may be disposed in the external pad bonding region PA. Referring to FIG. 29, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220*a* disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220*a* disposed in the peripheral circuit region PREG through second input/output contact plugs 5403 and 5303, and the third input/output pad 5406 may be connected to at least one of the plurality of circuit elements 5220*a* disposed in the peripheral circuit region PREG through third input/output contact plugs 5404 and 5304.

In some example embodiments, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In this case, the third input/output contact plug 5404 may be formed by at least one of various processes.

In some example embodiments, as illustrated in a region 'B1', the third input/output contact plug 5404 may extend in a third direction (e.g., the Z-axis direction), and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In certain example embodiments, as illustrated in a region 'B2', the third input/output contact plug 5404 may extend in the third direction (e.g., the Z-axis direction), and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In certain example embodiments, the input/output contact plug may overlap with the third substrate 5410. For example, as illustrated in a region 'C', the second input/output contact plug 5403 may penetrate the interlayer insulating layer 5415 of the second cell region CREG2 in the third direction (e.g., the Z-axis direction) and may be electrically connected to the second input/output pad 5405 through the third substrate 5410. In this case, a connection structure of the second input/output contact plug 5403 and the second input/output pad 5405 may be realized by various methods.

In some example embodiments, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, example embodiments are not limited thereto, and in certain example embodiments, the diameter of the second input/output contact plug 5403 may become progressively less toward the second input/output pad 5405.

In certain example embodiments, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In certain example embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371e or may become progressively greater toward the lower metal pattern 5371e.

Meanwhile, in some example embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some embodiments, as illustrated in a region 'D1', the slit 5411 may be formed to penetrate the third substrate 5410. For example, the slit 5411 may be used to prevent or reduce the third substrate 5410 from being finely cracked when the opening 5408 is formed. However, example embodiments are not limited thereto, and in certain example embodiments, the slit 5411 may be formed to have a depth ranging from about 60% to about 70% of a thickness of the third substrate 5410.

In certain example embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In certain example embodiments, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the word-line bonding region WLBA. Since the insulating material 5413 is formed in the slit 5411, it is possible to prevent or reduce a voltage provided through the second input/output pad 5405 from affecting a metal layer disposed on the third substrate 5410 in the word-line bonding region WLBA.

Meanwhile, in certain example embodiments, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some example embodiments, at least one of the second substrate 5310 of the first cell region CREG1 or the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

Figure 30:
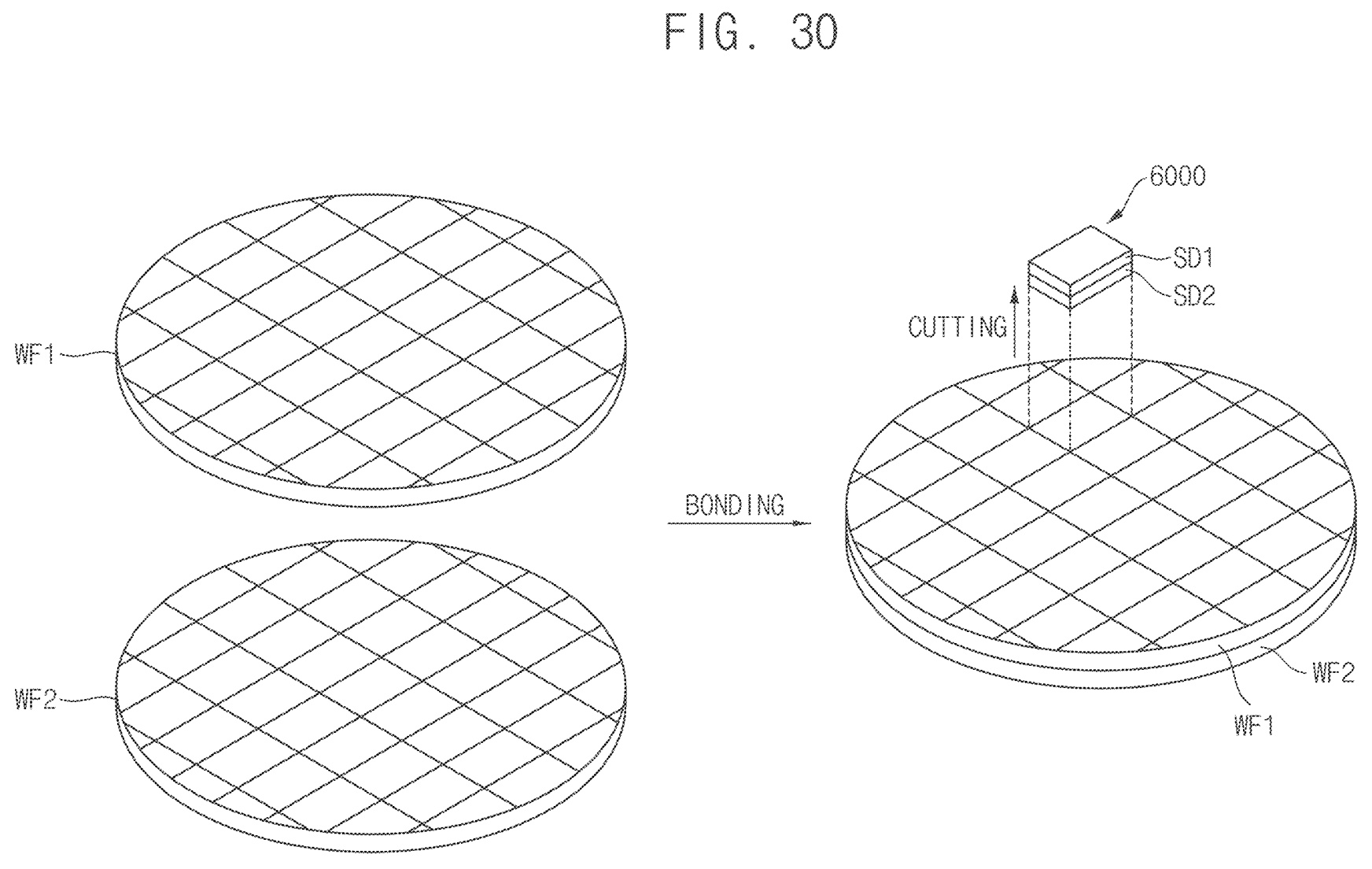

FIG. 30 is a diagram illustrating a manufacturing process of a stacked semiconductor device according to some example embodiments.

Referring to FIG. 30, respective integrated circuits may be formed on a first wafer WF1 and a second wafer WF2. The memory cell array may be formed in the first wafer WF1, and the peripheral circuits may be formed in the second wafer WF2. A diameter of either of the first wafer WF1 or the second wafer WF2 may be, for example, 200 mm, or 300 mm, or 450 mm, but example embodiments are not limited thereto. The diameter of the first wafer WF1 may be the same as, or different from (e.g. smaller than or bigger than) a diameter of the second wafer WF2. A number of die on the first wafer WF1 may be the same as, or different from (e.g. more than or less than) a number of die on the second wafer WF2. Die on the first wafer WF1 may be aligned and positioned the same as die on the second wafer WF2; however, example embodiments are not limited thereto. Either or both of the first wafer WF1 and the second wafer WF2 may be doped, e.g. lightly doped with impurities such as boron and/or phosphorus and/or arsenic; alternatively, at least one of the first wafer WF1 and the second wafer WF2 may be undoped.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the memory device 6000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1, and each cut portion of the second wafer WF2 corresponds to the second semiconductor die SD2. For example, the memory device 5000 of FIG. 29 may be manufactured based on the manufacturing process of FIG. 30.

FIG. 31 is a flow chart illustrating a method of manufacturing a nonvolatile memory device according to some example embodiments.

Manufacturing method of FIG. 31 may be applied to manufacturing the nonvolatile memory device 500 of FIG. 29.

Referring to FIGS. 29 and 31, there is provided a method of manufacturing a nonvolatile memory device 5000 including a first chip and a second chip. The first chip includes a memory cell region and is provided on a first wafer and the second chip includes a peripheral circuit region PREG having a page buffer circuit and at least one driver spaced apart from the page buffer circuit and is provided on a second wafer different from the first wafer.

According to the method, a second chip including a peripheral circuit region PREG having a page buffer circuit and at least one driver spaced apart from the page buffer circuit is formed (provided) on the second wafer (operation S510). A first test is performed on the second chip (operation S600). It is determined whether the second chip passes the first test based on a result of the first test (operation S660). When the second chip does not pass the first test (NO in operation S660), the second chip is deemed to have a defect (operation S680).

A first chip including a memory cell region is formed (provided) on the first wafer (operation 5710) separately from forming and testing the second chip (operation S710). A second test is performed on the first chip (operation S730). It is determined whether the first chip passes the second test based on a result of the second test (operation S760). When the first chip does not pass the second test (NO in operation S760), the first chip is deemed to have a defect (operation S780).

When the second chip passes the first test (YES in operation 5660) and the first chip does passes the second test (YES in operation S760), the first chip and the second chip are bonded (operation 5790) and the nonvolatile memory device 5000 is provided as a good product (operation S800).

FIG. 32 is a flow chart illustrating operations of a first test on the second chip in FIG. 31 according to some example embodiments.

For convenience of explanation, operations of the first test will be explained with reference to FIGS. 16, 31 and 32.

Referring to FIGS. 16, 31 and 32, for performing the first test on the second chip (operation S600), an on-state of memory cells which are not connected to the page buffer circuit 210 is mimicked by providing at least one discharging path between a sensing node SO and a plurality of discharge transistors 281, 282 and 283 of the driver 260 (operation S610). The driver 260 is a connected to a connection transistor ERT coupled to a bit-line node BLN of the page buffer circuit 210 (or a page buffer PBa) through a conduction line CL.

A sensing and latching operation is performed in the page buffer circuit 210, with the on-state being mimicked (operation S630). It is determined whether the page buffer circuit 210 operates normally based on a result of the sensing and latching operation (operation S650).

It may be determined whether each of other circuit elements operates normally after determining whether the page buffer circuit 210 operates normally.

Since a page buffer circuit including the page buffer PBa of FIG. 16 or a page buffer circuit including the page buffers PB1 and PB2 of FIG. 21 may be provided in the peripheral circuit region PREG using at least some of the circuit elements 5220a, 5220b and 5220c in FIG. 29, the testing method described with reference to FIGS. 3 through 7B may be applied to FIG. 32.

Therefore, according to some example embodiments, a test on a page buffer circuit, which is formed individually from or prior to a memory cell array, is performed by mimicking on-state of memory cells, which are not connected to the page buffer circuit, by providing at least one discharging path between a sensing node SO and a plurality of discharge transistors of at least one driver. Therefore, a test with respect to various test items may be performed on an off-state of the memory cells and an on-state of the memory cells with the memory cells not being connected to the page buffer circuit, and thus may enhance test coverage.

The test method of FIG. 32 may be performed on a plurality of second chips on the second wafer concurrently.

Figure 33:
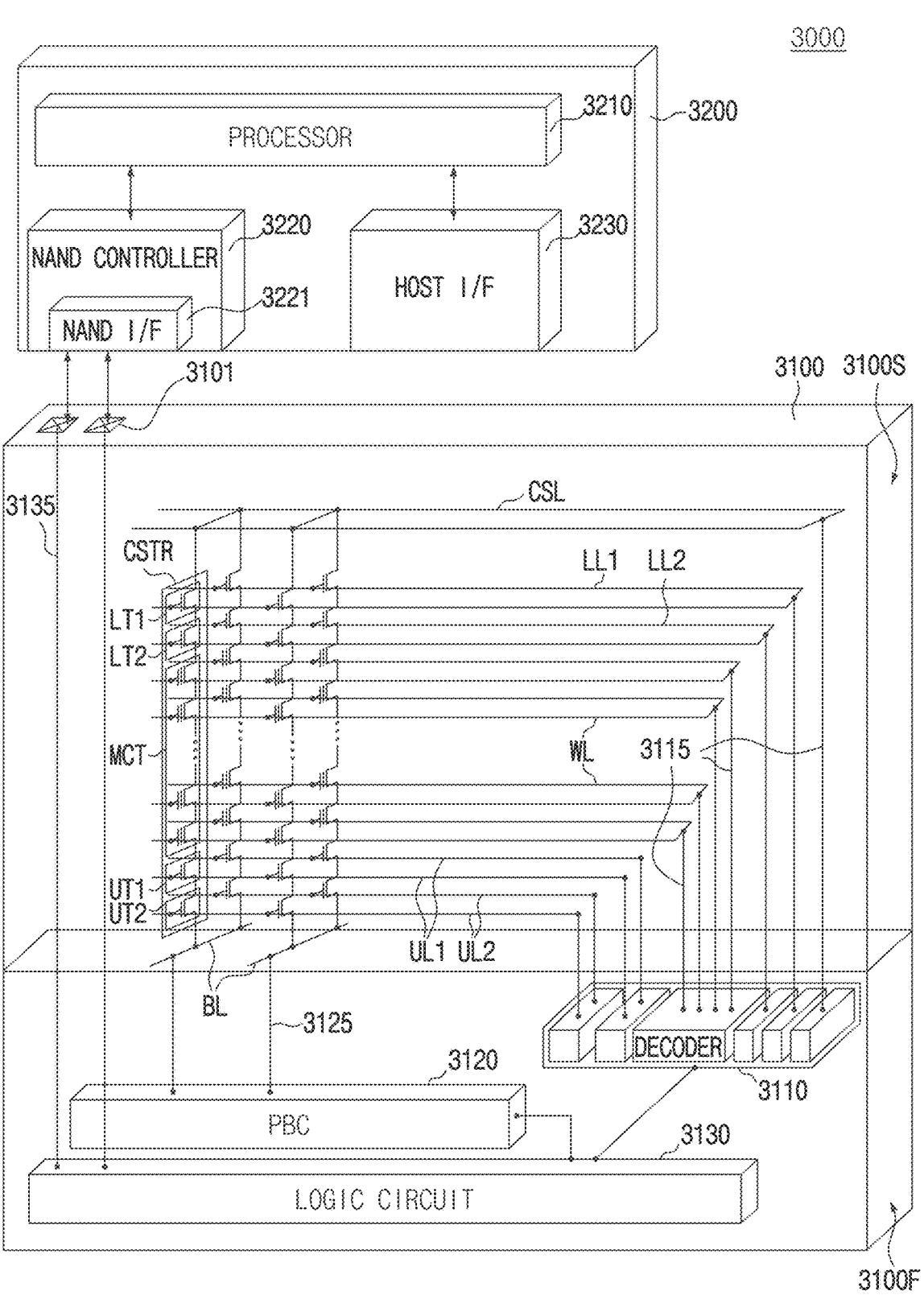
FIG. 33 is a block diagram illustrating an electronic system including a semiconductor device according to some example embodiments.

FIG. 33 is a block diagram illustrating an electronic system including a semiconductor device according to some example embodiments.

Referring to FIG. 33, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be or may include a non-volatile memory device, for example, a NAND flash memory device that will be illustrated with reference to FIGS. 8 to 28. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In some example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to some example embodiments may be packaged using various package types or package configurations.

Various example embodiments may be applied to various electronic devices and systems that include the nonvolatile memory devices and the memory packages. For example, example embodiments may be applied to systems such as one or more of a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

The foregoing is illustrative of various example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. For example, example embodiments are not necessarily mutually exclusive with one another. For example, some example embodiments may include one or more features described with reference to one or more figures, and may also include one or more other features described with reference to one or more other figures.

What is claimed is:

1. A method of fabricating a nonvolatile memory device that includes a first semiconductor layer and a second semiconductor layer, wherein a plurality of nonvolatile memory cells, a plurality of word-lines, and a plurality of bit-lines are provided on the first semiconductor layer and the second semiconductor layer is formed prior to the first semiconductor layer, the method comprising:

provide circuit elements including a page buffer circuit and at least one driver that are on the second semiconductor layer by forming semiconductor elements on the second semiconductor layer and forming patterns for wiring the semiconductor elements on the second semiconductor layer, the at least one driver spaced apart from the page buffer circuit;

mimicking an on-state of nonvolatile memory cells which are not connected to the page buffer circuit by providing at least one discharging path between a sensing node of the page buffer circuit and a plurality of discharge transistors of the at least one driver, wherein the at least one driver is connected to a connection transistor coupled to a bit-line node of the page buffer circuit through a conduction line;

performing, in the page buffer circuit, a sensing and latching operation with the on-state being mimicked; and determining whether the page buffer circuit operates normally based on a result of the sensing and latching operation, wherein at least two of the plurality of discharge transistors are commonly connected to a connection node and to a ground node as commonly connected discharge transistors, the providing the at least one discharging path includes turning on the at least two commonly connected discharge transistors with a common gate voltage, and the method includes determining a number of the plurality of discharge transistors to turn on, the number of the plurality of discharge transistors to turn on being inversely related to a time interval of discharge.

2. The method of claim 1, wherein mimicking the on-state of nonvolatile memory cells includes:

pre-charging the sensing node to a level of a power supply voltage;

interrupting a current supply to the sensing node; and turning on at least one of the plurality of discharge transistors, and wherein performing the sensing and latching operation includes:

latching a voltage level of the sensing node.

3. The method of claim 2, wherein the plurality of discharge transistors include k discharge transistors coupled in parallel between the connection node and the ground node, wherein k is a natural number greater than two and the connection node is connected to the conduction line, and the turning on the at least one of the plurality of discharge transistors includes turning on j discharge transistors of the k discharge transistors, j being a natural number less than or equal to k and greater than or equal to one.

4. The method of claim 2, wherein the plurality of discharge transistors include k discharge transistors coupled in parallel between a connection node and the ground node, wherein k is a natural number greater than two and the connection node is connected to the conduction line, and the turning on the at least one of the plurality of discharge transistors includes turning on the k discharge transistors.

5. The method of claim 1, wherein the at least one driver includes:

a first driver including a plurality of first discharge transistors, the first driver connected to a first connection transistor through a first conduction line, the first connection transistor coupled to a first bit-line node connected to a first sensing node of the page buffer circuit; and a second driver including a plurality of second discharge transistors, the second driver connected to a second connection transistor through a second conduction line, the second connection transistor coupled to a second bit-line node connected to a second sensing node of the page buffer circuit.

6. The method of claim 5, wherein the mimicking the on-state of nonvolatile memory cells includes:

pre-charging the first sensing node to a level of a power supply voltage and pre-charging the second sensing node to the level of the power supply voltage;

interrupting a current supply to each of the first sensing node and the second sensing node; and during a first time interval, turning on at least one of the plurality of first discharge transistors and at least one of the plurality of second discharge transistors.

7. The method of claim 6, wherein the performing the sensing and latching operation includes latching a voltage level of each of the first sensing node and the second sensing node.

8. The method of claim 6, wherein each of the plurality of first discharge transistors and the plurality of second discharge transistors include k discharge transistors, k being a natural number greater than two, and the turning on at least one of the plurality of first discharge transistors and at least one of the plurality of second discharge transistors includes:

turning on j discharge transistors of the first k discharge transistors, j being a natural number less than or equal to k and greater than or equal to one; and turning on i discharge transistors of second k discharge transistors, i being a natural number less than or equal to than k and greater than or equal to j.

9. The method of claim 5, wherein the mimicking the on-state of nonvolatile memory cells includes:

pre-charging the first sensing node to a level of a power supply voltage and the second sensing node to the level of the power supply voltage;

interrupting a current supply to each of the first sensing node and the second sensing node; and turning on at least one of the plurality of second discharge transistors during a first time interval while turning off the plurality of first discharge transistors during the first time interval.

10. The method of claim 9, wherein the performing the sensing and latching operation includes latching a voltage level of each of the first sensing node and the second sensing node.

11. The method of claim 9, wherein each of the plurality of first discharge transistors and the plurality of second discharge transistors include k discharge transistors, k being a natural number greater than two, the turning on at least one of the plurality of second discharge transistors and at least one of the plurality of second discharge transistors includes:

turning on j discharge transistors of the second k discharge transistors, j being a natural number less than or equal to k and greater than or equal to one.

12. The method of claim 1, wherein the page buffer circuit includes:

a plurality of page buffers arranged in a first horizontal direction; and a plurality of cache latches spaced apart from the plurality of page buffers in the first horizontal direction, the plurality of cache latches respectively corresponding to the plurality of page buffers and being commonly connected to a combined sensing node, wherein each of the plurality of page buffers includes:

a pass transistor connected to each sensing node and configured to be driven in response to a pass control signal, and a bit-line selection transistor coupled to the bit-line node and having a gate configured to receive a bit-line selection signal;

a first n-channel metal-oxide semiconductor (NMOS) transistor which is coupled between the bit-line selection transistor and an internal node and has a gate configured to receive a bit-line shut-off signal;

a second NMOS transistor which is coupled between the sensing node and the internal node and has a gate configured to receive a bit-line connection control signal;

a third NMOS transistor which is coupled between the internal node and a ground voltage and has a gate configured to receive a shield signal;

a first p-channel metal-oxide semiconductor (PMOS) transistor which is coupled between a power supply voltage and the sensing node and configured to pre-charge the sensing node in response to a load signal;

a second PMOS transistor which is coupled to the internal node, a precharge circuit and the sensing node and has a gate configured to receive a bit-line setup signal; and the connection transistor which is coupled between the bit-line node and the conduction line, and has a gate configured to receive a connection control signal.

13. The method of claim 12, wherein the mimicking the on-state of nonvolatile memory cells includes:

providing a conducting path between the sensing node and the bit-line node by activating the bit-line selection signal, activating the bit-line connection control signal, and deactivating the shield signal after the sensing node is precharged; and providing the at least one discharging path between the bit-line node and at least one of the plurality of discharge transistors by activating the connection control signal and activating at least one of a plurality of discharge control signals applied to respective one of the plurality of discharge transistors.

14. The method of claim 13, wherein the providing the at least one discharging path includes adjusting a time interval of the sensing node arriving at a trip level by varying a number of activated discharge control signals from among the plurality of discharge control signals.

15. A method of fabricating a nonvolatile memory device including a first chip and a second chip, wherein the first chip includes a memory cell region and is on a first wafer and the second chip includes a peripheral circuit region having a page buffer circuit and is on a second wafer different from the first wafer, the method comprising:

providing circuit elements including the page buffer circuit and at least one driver by forming semiconductor elements and patterns for wiring the semiconductor elements in a first substrate on the second wafer, the at least one driver being spaced apart from the page buffer circuit;

mimicking an on-state of nonvolatile memory cells which are not connected to the page buffer circuit by providing at least two discharging paths between a sensing node of the page buffer circuit and a plurality of discharge transistors of the at least one driver, wherein the at least one driver is connected to a connection transistor coupled to a bit-line node of the page buffer circuit through a conduction line, wherein at least two of the plurality of discharge transistors are commonly connected to a connection node and to a ground node as commonly connected discharge transistors, and the mimicking the on-state of the nonvolatile memory cells includes turning on the at least two commonly connected discharge transistors with a common gate voltage;

performing, in the page buffer circuit, a sensing and latching operation with the on-state being mimicked;

determining whether the page buffer circuit operates normally based on a result of the sensing and latching operation, and the method includes determining a number of the plurality of discharge transistors to turn on, the number of the plurality of discharge transistors to turn on being inversely related to a time interval of discharge.

16. The method of claim 15, wherein mimicking the on-state of nonvolatile memory cells includes:

pre-charging the sensing node to a level of a power supply voltage;

interrupting a current supply to the sensing node; and turning on at least one of the plurality of discharge transistors, and wherein performing the sensing and latching operation includes:

latching a voltage level of the sensing node.

17. The method of claim 15, wherein the at least one driver includes:

a first driver including a plurality of first discharge transistors, the first driver connected to a first connection transistor through a first conduction line, the first connection transistor coupled to a first bit-line node connected to a first sensing node of the page buffer circuit; and a second driver including a plurality of second discharge transistors, the second driver connected to a second connection transistor through a second conduction line, the second connection transistor coupled to a second bit-line node connected to a second sensing node of the page buffer circuit, and wherein the mimicking the on-state of nonvolatile memory cells includes:

pre-charging the first sensing node to a level of a power supply voltage and pre-charging the second sensing node to the level of the power supply voltage;

interrupting a current supply to each of the first sensing node and the second sensing node; and during a first time interval turning on at least one of the plurality of first discharge transistors and at least one of the plurality of second discharge transistors.

18. The method of claim 15, wherein the at least one driver includes:

a first driver including a plurality of first discharge transistors, the first driver connected to a first connection transistor through a first conduction line, the first connection transistor coupled to a first bit-line node connected to a first sensing node of the page buffer circuit; and a second driver including a plurality of second discharge transistors, the second driver connected to a second connection transistor through a second conduction line, the second connection transistor coupled to a second bit-line node connected to a second sensing node of the page buffer circuit, and wherein mimicking the on-state of nonvolatile memory cells includes:

pre-charging the first sensing node to a level of a power supply voltage and precharging the second sensing node to the level of the power supply voltage;

interrupting a current supply to each of the first sensing node and the second sensing node; and turning on at least one of the plurality of second discharge transistors during a first time interval while turning off the plurality of first discharge transistors during the first time interval.

19. A nonvolatile memory device comprising:

a first semiconductor layer in which a plurality of non-volatile memory cells, a plurality of word-lines and a plurality of bit-lines are provided; and a second semiconductor layer that is below the first semiconductor layer, wherein the second semiconductor layer includes circuit elements including a page buffer circuit, at least one driver and a control circuit by forming semiconductor elements and patterns for wiring the semiconductor elements on the second semiconductor layer, the at least one driver being spaced apart from the page buffer circuit, wherein the control circuit, with the first semiconductor layer not being connected to the second semiconductor layer, is configured to:

mimic an on-state of nonvolatile memory cells which are not connected to the page buffer circuit by providing at least two discharging paths between a sensing node of the page buffer circuit and a plurality of discharge transistors of the at least one driver, wherein the at least one driver is connected to a connection transistor coupled to a bit-line node of the page buffer circuit through a conduction line, wherein at least two of the plurality of discharge transistors are commonly connected to a connection node and to a ground node as commonly connected discharge transistors, and the mimicking the on-state of the nonvolatile memory cells includes turning on the at least two commonly connected discharge transistors with a common gate voltage;

perform, in the page buffer circuit, a sensing and latching operation with the on-state being mimicked;

determine whether the page buffer circuit operates normally based on a result of the sensing and latching operation;

provide a result of the determining to an external test device, and determine a number of the plurality of discharge transistors to turn on, the number of the plurality of discharge transistors to turn on being inversely related to a time interval of discharge.

20. The nonvolatile memory device of claim 19, wherein the first semiconductor layer is stacked on the second semiconductor layer after the circuit elements pass a test, and wherein at least a portion of the plurality of bit-lines are connected to the page buffer circuit through a through via.

* * * * *